(12) United States Patent
Sasaki et al.

(10) Patent No.: US 10,541,222 B2
(45) Date of Patent: Jan. 21, 2020

(54) CONDUCTIVE COMPOSITION AND ELECTRONIC PARTS USING THE SAME

(71) Applicant: NAMICS CORPORATION, Niigata-shi, Niigata (JP)

(72) Inventors: Koji Sasaki, Niigata (JP); Noritsuka Mizumura, Niigata (JP)

(73) Assignee: NAMICS CORPORATION, Tokyo (JP)

(*) Notice: Subject to any disclaimer, the term of this patent is extended or adjusted under 35 U.S.C. 154(b) by 0 days.

(21) Appl. No.: 15/519,719

(22) PCT Filed: Oct. 22, 2015

(86) PCT No.: PCT/JP2015/079774
§ 371 (c)(1),
(2) Date: Apr. 17, 2017

(87) PCT Pub. No.: WO2016/063931
PCT Pub. Date: Apr. 28, 2016

(65) Prior Publication Data
US 2017/0243849 A1    Aug. 24, 2017

(30) Foreign Application Priority Data

Oct. 24, 2014  (JP) .................................. 2014-217822

(51) Int. Cl.
| | | |
|---|---|---|
| *H01L 23/00* | (2006.01) | |
| *C08K 3/08* | (2006.01) | |
| *H01B 1/22* | (2006.01) | |
| *C08L 67/00* | (2006.01) | |
| *C09J 9/02* | (2006.01) | |
| *C09J 11/06* | (2006.01) | |
| *C09J 167/00* | (2006.01) | |

(52) U.S. Cl.
CPC ................ *H01L 24/29* (2013.01); *C08K 3/08* (2013.01); *C08L 67/00* (2013.01); *C09J 9/02* (2013.01);
(Continued)

(58) Field of Classification Search
CPC ...................................................... H01C 1/00
(Continued)

(56) References Cited

U.S. PATENT DOCUMENTS

| | | |
|---|---|---|
| 8,802,989 B2 | 8/2014 | Ishizawa et al. |
| 2005/0116203 A1 | 6/2005 | Takahashi et al. |

(Continued)

FOREIGN PATENT DOCUMENTS

| | | | |
|---|---|---|---|
| JP | 2002-201284 | * 7/2002 | ................ C08J 3/12 |
| JP | 2002201284 A | 7/2002 | |

(Continued)

OTHER PUBLICATIONS

Butyl Cellosolve Acetate—Technical Data Sheet by DOW Chemical, Mar. 2004, http://www.innovation-plus.com.tw/essence-plus689/program_download/good/201807152138419876.pdf.*

(Continued)

*Primary Examiner* — Khanh T Nguyen
(74) *Attorney, Agent, or Firm* — Holtz, Holtz & Volek PC

(57) ABSTRACT

A conductive composition, which can form bonded portions and is capable of maintaining a thickness of the bonded portions and bonding strength, and which includes: (A) silver fine particles having a number average particle diameter of primary particles of 40 nm to 400 nm, (B) a solvent, and (C) thermoplastic resin particles having a maximal value of an endothermic peak in a DSC chart, determined by a measurement using a differential scanning calorimeter, within a range of 80° C. to 170° C.

24 Claims, 6 Drawing Sheets

(52) U.S. Cl.
CPC ............ *C09J 11/06* (2013.01); *C09J 167/00* (2013.01); *H01B 1/22* (2013.01); *H01L 24/83* (2013.01); *C08K 2003/0806* (2013.01); *C08K 2201/001* (2013.01); *C08K 2201/003* (2013.01); *C08L 2203/20* (2013.01); *H01L 2224/29239* (2013.01); *H01L 2224/8384* (2013.01); *H01L 2224/83851* (2013.01); *H01L 2924/061* (2013.01); *H01L 2924/068* (2013.01); *H01L 2924/069* (2013.01); *H01L 2924/0675* (2013.01); *H01L 2924/07001* (2013.01); *H01L 2924/35121* (2013.01)

(58) Field of Classification Search
USPC ........................................................ 252/500
See application file for complete search history.

(56) References Cited

U.S. PATENT DOCUMENTS

| | | |
|---|---|---|
| 2008/0272344 A1 | 11/2008 | Jiang et al. |
| 2011/0186340 A1 | 8/2011 | Kuramoto et al. |
| 2013/0142963 A1 | 6/2013 | Kirk et al. |
| 2014/0083740 A1 | 3/2014 | Ishizawa et al. |
| 2015/0218391 A1 | 8/2015 | Takahashi et al. |

FOREIGN PATENT DOCUMENTS

| | | | | |
|---|---|---|---|---|
| JP | 2002245853 A | | 8/2002 | |
| JP | 2006-183072 | * | 7/2006 | ................ B22F 1/00 |
| JP | 2010123760 A | | 6/2010 | |
| JP | 2011-159392 | * | 8/2011 | ............... H01B 1/22 |
| JP | 2011159392 A | | 8/2011 | |
| JP | 2011198674 A | | 10/2011 | |
| JP | 2014051590 A | | 3/2014 | |
| WO | 03085052 A1 | | 10/2003 | |
| WO | 2013081664 A1 | | 6/2013 | |
| WO | 2013146604 A1 | | 10/2013 | |

OTHER PUBLICATIONS

International Search Report (ISR) and Written Opinion dated Nov. 17, 2015 issued in International Application No. PCT/JP2015/079774.

Extended European Search Report (EESR) dated May 30, 2018 issued in counterpart European Application No. 15851902.5.

* cited by examiner

CONDUCTIVE COMPOSITION AND ELECTRONIC PARTS USING THE SAME

TECHNICAL FIELD

The present invention relates to a conductive composition and electronic parts using the same.

BACKGROUND ART

A paste containing silver fine particles is used for forming conductive circuits on circuit boards constituting a semiconductor device, electrodes for capacitors, etc., by forming a silver film having electrical conductivity by sintering silver fine particles with heating. In recent years, it has also been used for forming bonded portion in semiconductor devices such as bumps and the die attach materials, etc.

However, when the paste is used for forming a bonding portion such as a semiconductor device, etc., there is a problem that sintering of the silver fine particles in the paste causes volume shrinkage of the paste so that the thickness of the bonded portion between the semiconductor element and the substrate is reduced, so that sufficient bonding strength cannot be obtained. In addition, when the bonded portion are formed by using a paste containing silver fine particles, a thickness of the adhered portion is controlled by subjecting to the pressurizing treatment in addition to the heat treatment. However, in recent years, the size of the semiconductor element becomes small, and accompanied by the reduction of the size of the semiconductor element, it becomes difficult to control the thickness by applying a load to the semiconductor element.

Further, the modulus of elasticity of the bonded portion becomes large by sintering of the silver fine particles in the paste, in other words, the bonded portion become hard so that the bonded portion cannot follow the change in temperature due to repeated use of the electronic parts using the semiconductor element, whereby crack of the semiconductor element, crack at the bonded portion and peeling of the bonding surface, etc., are generated in some cases.

In order to relax the shrinkage stress generated by the volume shrinkage due to sintering of the metal particles in the paste at the bonded portion, it has been proposed a conductive bonding material comprising metal fine particles and metal coated-resin particles in which a metal which is capable of sintering with the metal fine particles is coated onto the surface of the resin particles having a larger particle size than those of the metal fine particles as an aggregate (Patent document 1).

In addition, in order to suppress lowering in connection reliability due to the volume shrinkage of the connection conductor, it has been proposed a filling material for electrical conduction comprising a mixture of a metal filler, a paraffinic hydrocarbon which melts at a temperature lower than the sintering temperature of the metal filler and is a solid state at room temperature, and a resin comprising a turpentine oil or a fatty acid which has a low melting point and is a solid at room temperature (Patent document 2).

PRIOR ART DOCUMENTS

Patent Documents

Patent document 1: JP 2011-198674A
Patent document 2: JP 2010-123760A

SUMMARY OF THE INVENTION

Problems to be Solved by the Invention

In the conductive bonding material disclosed in Patent document 1, a size of the particles themselves of the resin having a particle diameter larger than those of the metal fine particles does not change, so that the volume shrinkage due to sintering of the metal fine particles at the portion containing no resin particle cannot be suppressed, whereby there is a problem that voids are generated at the bonded portion by the volume shrinkage due to sintering of the metal fine particles.

In the filling material for electrical conduction disclosed in Patent document 2, the resin which has a low melting point and is a solid at room temperature decomposes or volatilizes at a temperature lower than the sintering temperature of the metal filler, so that there is a problem that voids are generated at the bonded portion. In addition, in the conductive filling material after sintering, the resin which has a low melting point and is a solid at room temperature decomposes or volatilizes at the time of sintering the metal filler in the conductive filling material, so that the resin does not exist in the sintered conductive filling material or the amount thereof is extremely little. Since in the sintered conductive filling material no resin is present or the amount of the resin is extremely little so that the modulus of elasticity of the bonded portion becomes large whereby the stress relaxation property is inferior. For this reason, in the electronic parts in which the semiconductor element is bonded by the sintered conductive filling material, the bonded portion cannot follow the change in temperature due to repeated use, whereby the problems of crack of the semiconductor element, crack at the bonded portion and peeling at the bonding interface, etc., cannot be avoided.

Means to Solve the Problems

The present inventors have found that, to solve the above-mentioned problems, when a conductive composition contains silver fine particles, a solvent, and thermoplastic resin particles having a maximal value of an endothermic peak in a DSC chart obtained by a measurement using a differential scanning calorimeter in a specific range, a thickness (hereinafter referred to as "coating thickness") of the coated conductive composition can be secured, and the thermoplastic resin particles in the conductive composition are deformed at the time of sintering the silver fine particles and follow the shrinkage at the time of curing the conductive composition to suppress generation of the voids and bonding strength can be maintained, whereby the present invention has been accomplished.

The present invention [1] is directed to a conductive composition comprising (A) silver fine particles having a number average particle diameter of primary particles of 40 nm to 400 nm, (B) a solvent and (C) thermoplastic resin particles having a maximal value of an endothermic peak in a DSC chart obtained by a measurement using a differential scanning calorimeter is within the range of 80° C. to 170° C.

The present invention [2] is directed to the conductive composition of the present invention [1], wherein the silver fine particles (A) have (a) a number average particle diameter of primary particles of 40 nm to 350 nm, (b) a crystallite diameter of 20 nm to 70 nm and (c) a ratio of a number average particle diameter of primary particles based on the crystallite diameter of 1.5 to 5.

The present invention [3] is directed to the conductive composition described in the present invention [1] or 2, wherein the silver fine particles (A) are contained in a paste containing 40 to 95% by mass of the silver fine particles based on 100% by mass of the paste and a solvent, and the silver fine particles (A) in the paste is a material which is sintered when it is maintained under the temperature condition of 180 to 250° C. for 20 minutes to 2 hours.

The present invention [4] is directed to the conductive composition of any one of the present invention [1] to [3], wherein the composition further contains (D) metal particles having a number average particle diameter of primary particles of 0.5 µm to 20 µm.

The present invention [5] is directed to the conductive composition described in any one of the present invention [1] to [4], wherein the maximal value of the endothermic peak of the thermoplastic resin particles (C) in a DSC chart obtained by a measurement using a differential scanning calorimeter is within a range of 110° C. to 140° C.

The present invention [6] is directed to the conductive composition described in any one of the present invention [1] to [5], wherein a number average particle diameter of primary particles of the thermoplastic resin particles (C) is 1 to 50 µm.

The present invention [7] is directed to the conductive composition described in any one of the present invention [4] to [6], wherein 0.1 to 10 parts by mass of the thermoplastic resin particles (C) is contained based on a total of the silver fine particles (A) and the metal particles (D) as 100 parts by mass.

The present invention [8] is directed to the conductive composition described in any one of the present invention [1] to [7], wherein the thermoplastic resin constituting the thermoplastic resin particles (C) is at least one thermoplastic resin selected from the group consisting of polyester, polyurethane, polyamide, polycarbonate and polyolefin.

The present invention [9] is directed to the conductive composition described in any one of the present invention [1] to [8], wherein the composition further contains (E) a thermosetting resin, and the thermosetting resin contains at least one kind of a thermosetting resin selected from the group consisting of an epoxy resin, a phenol resin and a silicone resin.

The present invention [10] is directed to the conductive composition described in any one of the present invention [1] to [9], wherein the solvent (B) is selected from the group consisting of diethylene glycol monobutyl ether acetate, 2-ethyl-1,3-hexane diol and 2,2,4-trimethyl-1,3-pentane diol 2-methylpropanoate.

The present invention [11] is directed to electronic parts which have a bonded portion in which parts are bonded by using the conductive composition described in any one of the present invention [1] to [10].

Effects of the Invention

In the present invention, the conductive composition comprises silver fine particles, a solvent and thermoplastic resin particles having a maximal value of a endothermic peak in a DSC chart obtained by the measurement using a differential scanning calorimeter within a specific range, and a coating thickness of the conductive composition can be maintained by the thermoplastic resin particles. In the present invention, the thermoplastic resin particles are deformed at the time of sintering the silver fine particles, and the thermoplastic resin particles follow the shrinkage of the conductive composition at the time of curing, whereby occurrence of voids at the bonded portion is suppressed and the bonding strength at the bonded portion can be maintained. In the present invention, the modulus of elasticity at the bonded portion bonded by the conductive composition can be made small by containing specific thermoplastic resin particles in the conductive composition, crack of the objects to be bonded, crack at the bonded portion and peeling at the bonding interface, etc., can be suppressed.

EMBODIMENTS TO CARRY OUT THE INVENTION

Figure 1:
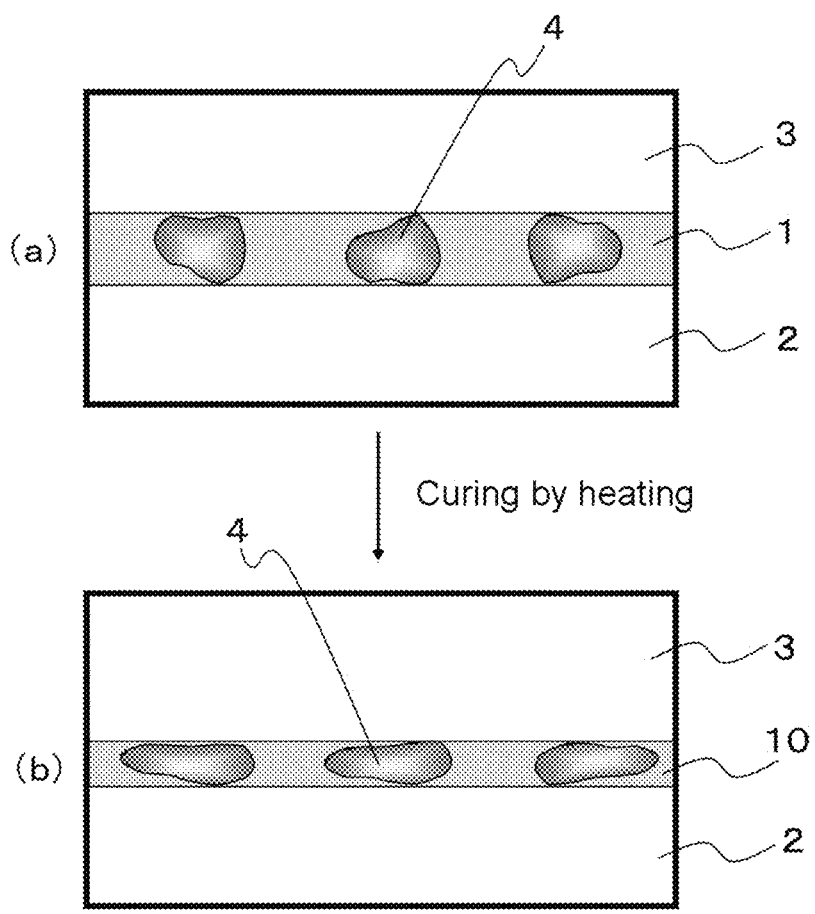
FIG. 1 shows bonded portion according to the present embodiment schematically, and (a) is a schematic cross-sectional view before heating and (b) is a schematic cross-sectional view after curing by heating.

The conductive composition of the invention comprises (A) silver fine particles having a number average particle diameter of primary particles of 40 nm to 400 nm, (B) a solvent and (C) thermoplastic resin particles having a maximal value of an endothermic peak in a DSC chart obtained by a measurement using a differential scanning calorimeter within the range of 80° C. to 170° C.

[(A) Silver Fine Particles Having Number Average Particle Diameter of Primary Particles of 40 nm to 400 nm]

An average particle diameter of the silver fine particles (A) used in the present invention refers to a number average particle diameter based on a number by the laser diffraction scattering type particle size distribution measurement. The silver fine particles (A) have a number average particle diameter of primary particles of 40 nm to 400 nm.

As the silver fine particles of (A), silver fine particles coated or treated by an organic material, and silver fine particles in the form of being dispersed in an organic medium may be used. The silver fine particles in the form of being dispersed in an organic medium may be silver fine particles reduced and precipitated in the presence of an organic material. In the points of preventing from aggregation of the silver fine particles and for preparing a heat conductive paste, the silver fine particles in the form of being dispersed in an organic medium can be preferably used. An organic material is attached onto the surface of such silver fine particles so that it can be understood that the weight of the silver fine particles can be changed due to volatilization or pyrolysis, etc., of the organic material by heating.

It is preferred that the silver fine particles (A) have (a) a number average particle diameter of primary particles of 40 nm to 350 nm, (b) a crystallite diameter of 20 nm to 70 nm and (c) a ratio of the number average particle diameter of primary particles to the crystallite diameter of 1.5 to 5.

In the present specification, the crystallite diameter is a result of the measurement of a powder X-ray diffraction method using a Kα ray of Cu as a radiation source to obtain a full width at half maximum intensity of index (1,1,1) plane and calculation by using the Scherrer's formula.

The silver fine particles (A) preferably have an average particle diameter of the primary particles of 40 to 350 nm, more preferably 40 to 100 nm, further preferably 50 to 80 nm. Incidentally, the silver fine particles (A) are, in general, substantially spherical. If the number average particle diameter of the primary particles of the silver fine particles (A) is within the above-mentioned range, aggregation of the silver fine particles is suppressed and storage stability can be likely obtained.

The silver fine particles (A) preferably have the crystallite diameter of 20 to 70 nm, more preferably 20 to 50 nm. If the crystallite diameter is within the range, the volume shrinkage at the time of sintering can be suppressed and denseness or surface smoothness of the bonded portion (silver film) formed after sintering can be ensured.

The silver fine particles (A) preferably have a ratio of the number average particle diameter of primary particles to the crystallite diameter of the silver fine particles (the number average particle diameter of primary particles/the crystallite diameter) in the range of 1.5 to 5, more preferably 1.5 to 4, and further preferably 1.5 to 3. If the above-mentioned ratio is within the range, for example, the bonded portion showing sufficient conductivity can be formed at the sintering temperature of 200° C. or lower.

Silver fine particles obtained by acting a primary amine on a silver salt of a carboxylic acid, and then, subjecting the resulting material to reducing reaction to precipitate the object, or silver fine particles coated or treated by an organic material can be used as such silver fine particles. As the former, silver fine particles disclosed in JP2006-183072A, JP2011-153362A, etc., may be exemplified, and as the latter, silver fine particles disclosed in JP2009-289745A, JP2010-65277A, etc., may be exemplified. The silver fine particles of (A) are nano order particles, have a large total surface area per a unit weight, high surface energy, good sinterability in the first place, and in addition, the surface of silver is exposed due to volatilization, thermal decomposition or dissolution by a solvent, etc., of the organic material at the surface, whereby the silver fine particles are directly contacted with each other so that sintering tends to proceed.

More specifically, the silver fine particles of (A) can be produced by mixing a silver salt of a carboxylic acid and an aliphatic primary amine, then, a reducing agent is added to the mixture and the particles are precipitated at a reaction temperature of 20 to 80° C.

The silver salt of a carboxylic acid is not particularly limited. The silver salt of a carboxylic acid may be a silver salt of either an aliphatic or an aromatic carboxylic acid. Also, it may be a silver salt of a monocarboxylic acid or a silver salt of a polyvalent carboxylic acid such as a dicarboxylic acid, etc. The silver salt of the aliphatic carboxylic acid may be a silver salt of a linear aliphatic carboxylic acid or may be a silver salt of a cyclic aliphatic carboxylic acid. It is preferably a silver salt of an aliphatic monocarboxylic acid, more preferably a silver salt of a linear aliphatic monocarboxylic acid, further preferably silver acetate, silver propionate or silver butyrate, and particularly silver acetate. These may be used a single kind alone or two or more kinds in combination.

The aliphatic primary amine is not particularly limited, and may be a linear aliphatic primary amine or a cyclic aliphatic primary amine. Also, it may be a monoamine compound or a polyamine compound such as a diamine compound, etc. In the aliphatic primary amine, those in which the aliphatic hydrocarbon group is substituted by a hydroxyl group, or an alkoxy group such as a methoxy group, an ethoxy group, a propyl group, etc., are contained, and more preferably 3-methoxypropylamine, 3-aminopropanol and 1,2-diaminocyclohexane. These may be used a single kind alone or two or more kinds in combination.

An amount of the aliphatic primary amine to be used may be determined by from the requirements of the process such as post-treatment of the fine silver particles to be produced and the apparatus, but from the viewpoint of obtaining silver fine particles having a controlled particle diameter, it is preferably 1 equivalent or more based on 1 equivalent of the silver salt of a carboxylic acid. Considering the influence of an excessive aliphatic primary amine on the environment etc., the amount of the aliphatic primary amine to be used is preferably 1.0 to 3.0 equivalent, more preferably 1.0 to 1.5 equivalent, and particularly preferably 1.0 to 1.1 equivalent based on 1 equivalent of the silver salt of a carboxylic acid. In particular, when a liquid obtained by precipitating silver fine particles by a reducing agent is used in the subsequent step as a paste containing the silver fine particles, there is a possibility that an excessive aliphatic primary amine is vaporized by heating, so that it is desired to employ the above-mentioned preferred range of the amount to be used.

The silver salt of a carboxylic acid and the aliphatic primary amine can be mixed in the absence of or in the presence of an organic solvent, and in the viewpoint of easiness in the mixing, it is preferably carried out in the presence of the organic solvent. The organic solvent may be an alcohol such as ethanol, propanol, butanol, etc., an ether such as propylene glycol dibutyl ether, etc., and an aromatic hydrocarbon such as toluene, etc. These may be used a single kind alone or two or more kinds in combination. An amount of the organic solvent to be used may be an optional amount from the viewpoint of convenience of mixing and productivity of the silver fine particles in the subsequent step.

The silver salt of a carboxylic acid and the aliphatic primary amine may be mixed by, for example, adding the silver salt of a carboxylic acid to a primary aliphatic amine, or a mixture comprising the primary aliphatic amine and the organic solvent while stirring. After completion of the addition, stirring may be optionally continued. During the stirring, the temperature is preferably maintained to 20 to 80° C., more preferably 20 to 60° C.

Thereafter, a reducing agent is added to precipitate silver fine particles. The reducing agent may be preferably formic acid, formaldehyde, ascorbic acid or hydrazine in the viewpoint of controlling the reaction, more preferably formic acid. These may be used a single kind alone or two or more kinds in combination.

An amount of the reducing agent to be used is generally an oxidation-reduction equivalent or more based on the silver salt of a carboxylic acid, and the oxidation-reduction equivalent is preferably 0.5 to 5-fold, more preferably 1 to 3-fold. When the silver salt of a carboxylic acid is a silver salt of a monocarboxylic acid and formic acid is used as the reducing agent, an amount of the formic acid to be used in terms of mol is preferably 0.5 to 1.5 mol based on 1 mol of the silver salt of a carboxylic acid, more preferably 0.5 to 1.0 mol, and further preferably 0.5 to 0.75 mol.

In the addition of the reducing agent and the reaction thereafter, a temperature is preferably maintained to 20° C. to 80° C. The temperatures at the addition of the reducing agent and the reaction thereafter is more preferably 20 to 70° C., and further preferably 20 to 60° C. If the temperature is within the range, particle growth of the silver fine particles is sufficient, productivity is high and secondary aggregation can be suppressed. The time required for the addition of the reducing agent and the reaction thereafter depends on the scale of the reaction apparatus, and generally 10 minutes to 10 hours. At the time of the addition of the reducing agent and the reaction thereafter, if necessary, an organic solvent including an alcohol such as ethanol, propanol, butanol, etc., an ether such as propylene glycol dibutyl ether, etc., and an aromatic hydrocarbon such as toluene, etc., may be additionally added thereto.

In the addition of the reducing agent and the reaction thereafter, an amount (mol) of the silver salt of a carboxylic acid based on the total volume (L) of the solution in which the silver salt of a carboxylic acid and the aliphatic primary amine are mixed, a reducing agent and an optional organic solvent is preferably set within the range of 1.0 to 6.0 mol/L, more preferably 2.0 to 5.0 mol/L, and further preferably 2.0 to 4.0 mol/L. If the concentration is within the range, heat of reaction can be removed by sufficiently carrying out stirring of the reaction solution, so that the average particle diameter of the precipitating silver fine particles becomes appropriate, and eventually, there is no hindrance to the operations such as precipitation decant, solvent substitution, etc. in the subsequent steps.

When the reaction is carried out by a semi-batch system in which a solution in which the silver salt of a carboxylic acid and the aliphatic primary amine have been mixed and an optional organic solvent are charged in a reaction apparatus, and the reducing agent is supplied continuously, a precipitated amount of the silver fine particles per a required time of one hour from starting addition of the reducing agent to completion of the reaction per a total volume of the mixed solution of the silver salt of a carboxylic acid and the aliphatic primary amine, the reducing agent and the optional organic solvent of 1L can be made in the range of 0.3 to 1.0 mol/h/L, so that productivity is extremely large. When the reaction is carried out in a continuous reaction system (continuous complete mixing tank or flow type), further greater productivity can be obtained, which gives a large gain to the industrial implementation.

The thus obtained silver fine particles have narrow particle size distribution, and the geometric standard deviation can be made 2.0 or less. In the present specification, the geometric standard deviation refers to a ratio of the 84.3% particle size diameter (D84.3 value) to the 50% particle size diameter (D50 value) (D84.3 value/D50 value) on a number basis by the laser diffraction scattering type particle size distribution measurement.

The silver fine particles precipitated by the reaction can be collected by precipitating the same and the supernatant is removed by decantation, etc., or by adding a solvent including an alcohol, etc., such as methanol, ethanol, terpineol, etc., and separating the same. The layer containing the silver fine particles can be used as such in the state of containing the solvent. When the silver fine particles are used in the state of a paste containing the silver fine particles and the solvent, a content of the silver fine particles in the paste is preferably 40 to 95% by mass, more preferably 45 to 90% by mass.

As the other methods, the silver fine particles of (A) can be obtained by coating silver fine particles produced by the reducing method, the pulverizing method, the electrolytic method, the atomizing method, the heat treatment method, or a combination thereof with an organic material. From the viewpoint of low temperature sinterability, it is preferred that the silver fine particles produced by the reducing method are coated by the organic material.

The organic material may be a higher or middle fatty acid and a derivative thereof. The derivative may be exemplified by a higher or middle fatty acid metal salt, a higher or middle fatty acid amide, a higher or middle fatty acid ester and a higher or middle alkylamine. Among these, a higher or middle fatty acid is preferred.

The higher fatty acid is a fatty acid having 15 or more carbon atoms, and may be exemplified by a linear saturated fatty acid such as pentadecanoic acid, hexadecanoic acid (palmitic acid), heptadecanoic acid, octadecanoic acid (stearic acid), 12-hydroxy-octadecanoic acid (12-hydroxystearic acid), eicosanoic acid (arachidic acid), docosanoic acid (behenic acid), tetracosanoic acid (lignoceric acid), hexacosanoic acid (cerotic acid), octacosanoic acid (montanic acid), etc.; a branched saturated fatty acid such as 2-pentylnonanoic acid, 2-hexyldecanoic acid, 2-heptyldodecanoic acid, isostearic acid, etc.; and an unsaturated fatty acid such as palmitoleic acid, oleic acid, isooleic acid, elaidic acid, linoleic acid, linolenic acid, ricinoleic acid, gadoleic acid, erucic acid, selacholeic acid, etc.

The middle fatty acid is a fatty acid having 6 to 14 carbon atoms, and may be exemplified by a linear saturated fatty acid such as hexanoic acid (caproic acid), heptanoic acid, octanoic acid (caprylic acid), nonanoic acid (pelargonic acid), decanoic acid (capric acid), undecanoic acid, dodecanoic acid (lauric acid), tridecanoic acid, tetradecanoic acid (myristic acid), etc.; a branched saturated fatty acid such as isohexanoic acid, isoheptanoic acid, 2-ethylhexanoic acid, isooctanoic acid, isononanoic acid, 2-propylheptanoic acid, isodecanoic acid, isoundecanoic acid, 2-butyloctanoic acid, isododecanoic acid, isotridecanoic acid, etc.; and an unsaturated fatty acid such as 10-undecenoic acid, etc.

Those in which silver fine particles covered by the higher fatty acid and a derivative thereof are substituted by a lower aliphatic acid may be also used.

In the viewpoints of sinterability and dispersion stability of the silver fine particles (A), silver fine particles covered by an aliphatic acid having 12 to 18 carbon atoms are preferred.

The silver fine particles (A) may be used a single kind alone or two or more kinds in combination.

The silver fine particles (A) are preferably a material in which these are contained in a paste containing 40 to 95% by mass of the silver fine particles based on 100% by mass of the paste and a solvent, which is sintered when the silver fine particles (A) in the paste are retained under the temperature condition of 180 to 250° C. for 20 minutes to 2 hours. The silver fine particles (A) in the paste are more preferably those which are sintered when retained at a temperature condition of 190 to 220° C. for 20 minutes to 2 hours. The silver fine particles (A) in the paste are further preferably those which are sintered when retained at a temperature condition of 195 to 210° C. for 20 minutes to 2 hours. If the silver fine particles (A) in the paste are a material which can be sintered by the above-mentioned conditions, for example, the bonded portion showing sufficient conductivity can be formed by the silver fine particles (A) contained in the conductive composition at a sintering temperature of 200° C. or lower. Whether the silver fine particles (A) in the paste are sintered themselves or not when these are retained under the temperature condition of 180 to 250° C. for 20 minutes to 2 hours can be confirmed by, for example, a field emission type scanning electron microscope (JSM7500F) manufactured by JEOL Ltd.

A content of the silver fine particles (A) in the conductive composition is not particularly limited, and from the viewpoint that sufficient thermal conductivity is to be ensured, it is preferably 25% by mass or more in terms of silver based on the whole amount of the conductive composition as 100% by mass, more preferably 28% by mass or more, further preferably 30% by mass or more, and particularly preferably 31% by mass or more. In addition, the content of the silver fine particles (A) is, from the viewpoints that a thickness at the time of sintering of the conductive composition and stability of the same are to be ensured, it is preferably 95% by mass or less based on the whole amount of the conductive composition as 100% by mass, more preferably 92% by mass or less, further preferably 90% by mass or less, and particularly preferably 88% by mass or less.

The content of the silver fine particles (A) in the conductive composition is not particularly limited, and it is preferably 70% by mass or more in terms of silver based on the total amount (100% by mass) of the silver fine particles (A), the solvent (B) and the thermoplastic resin particles (C), more preferably 72% by mass or more, further preferably 73% by mass or more, and particularly preferably 75% by mass or more. In addition, the content of the silver fine particles (A) in the conductive composition is not particularly limited, and it is preferably 93% by mass or less based on the total of the silver fine particles (A), the solvent (B) and the thermoplastic resin particles (C), more preferably 92% by mass or less, further preferably 90% by mass or less, and particularly preferably 88% by mass or less.

If the content of the silver fine particles (A) in the conductive composition is within the above-mentioned range, a desired thickness of the bonded portion can be ensured and sufficient thermal conductivity can be ensured.

[(B) Solvent]

The solvent (B) to be used in the present invention may be those conventionally known in this field. For example, an alcohol-based solvent such as ethylene glycol, propylene glycol, benzyl alcohol, 2-ethyl-1,3-hexane diol, dihydroterpineol, etc.; an aromatic hydrocarbon-based solvent such as toluene, xylene, ethylbenzene, diethylbenzene, isopropylbenzene, amylbenzene, p-cymene, tetralin and a petroleum-based aromatic hydrocarbon mixture, etc.; a terpene alcohol such as terpineol, linalool, geraniol, citronellol, etc.; an ether alcohol-based solvent such as ethylene glycol monoethyl ether, ethylene glycol monobutyl ether, propylene glycol monomethyl ether, propylene glycol monoethyl ether, propylene glycol mono-n-butyl ether, ethylene glycol monophenyl ether, propylene glycol mono-tert-butyl ether, diethylene glycol monoethyl ether, diethylene glycol monobutyl ether, dipropylene glycol monomethyl ether, dipropylene glycol monobutyl ether, tripropylene glycol monomethyl ether, etc.; a ketone-based solvent such as methyl isobutyl ketone, etc.; and an ester-based solvent such as ethylene glycol monomethyl ether acetate, ethylene glycol monoethyl ether acetate, diethylene glycol monoethyl ether acetate, ethylene glycol monobutyl ether acetate, diethylene glycol monobutyl ether acetate, propylene glycol monomethyl ether acetate, propylene glycol monoethyl ether acetate, dipropylene glycol monoethyl ether acetate, 2,2,4-trimethyl-1,3-pentane diol 2-methylpropanoate, etc., and water, etc. may be used. The solvent may be used a single kind alone or two or more kinds in combination.

The solvent (B) is, for example, preferably those having a hydroxyl group and having a boiling point of 180 to 265° C., preferably an alcohol-based solvent having 180 to 250° C. Among these, diethylene glycol monobutyl ether acetate, 2-ethyl-1,3-hexane diol, 2,2,4-trimethyl-1,3-pentane diol 2-methylpropanoate, dihydroterpineol and benzyl alcohol are preferred, and above all, diethylene glycol monobutyl ether acetate, 2-ethyl-1,3-hexane diol and 2,2,4-trimethyl-1,3-pentane diol 2-methylpropanoate are more preferred.

A content of the solvent (B) in the conductive composition is not particularly limited, and it is preferably 1 to 20% by mass based on 100% by mass of the conductive composition, more preferably 1.5 to 18% by mass, and further preferably 2 to 15% by mass.

If the content of the solvent (B) in the conductive composition is within the above-mentioned range, it is excellent in stability, the conductive composition can be uniformly coated onto the object to be coated and it is excellent in printability and transferability. In addition, even when the solvent is vaporized at the time of sintering the silver fine particles (A), generation of the voids at the bonded portion to the object to be coated can be suppressed and the bonded portion having a desired thickness can be formed.

[(C) Thermoplastic Resin Particles]

The thermoplastic resin particles (C) to be used in the present invention are a material having the maximal value of the endothermic peak in a DSC chart obtained by a measurement using a differential scanning calorimeter within the range of 80° C. to 170° C. The thermoplastic resin particles (C) have the maximal value of the endothermic peak in a DSC chart obtained by a measurement using a differential scanning calorimeter preferably within the range of 100° C. to 160° C., more preferably 105° C. to 150° C., and further preferably 110° C. to 140° C.

If the thermoplastic resin particles (C) have the maximal value of the endothermic peak of the thermoplastic resin particles in the range of 80° C. to 170° C., preferably 100° C. to 160° C., more preferably 105° C. to 150° C., and further preferably in the range of 110° C. to 140° C., voids can be reduced by following the volume shrinkage at the time of sintering the silver fine particles, and, good thermal conductivity can be realized since sintering of the silver fine particles is not hindered. If the thermoplastic resin particles (C) have the maximal value of the endothermic peak in a DSC chart obtained by a measurement using a differential scanning calorimeter in the range of lower than 80° C., whereas it can follow the volume shrinkage at the time of sintering, but sintering of the silver fine particles is markedly inhibited, and the electric resistivity at the bonded portion is increased or the thermal conductivity is lowered in some cases. In addition, if the thermoplastic resin particles (C) have no maximal value of the endothermic peak in a DSC chart obtained by a measurement using a differential scanning calorimeter, the thermoplastic resin particles do not melt at a low temperature so that the thermoplastic resin particles cannot follow the volume shrinkage at the time of sintering the silver fine particles, so that generation of the voids at the bonded portion cannot be suppressed, whereby peeling occurred at the bonded portion after severe thermal cycling test.

FIG. 1 relates to the embodiment of the present invention, and shows a cross-sectional view schematically showing the bonded portion in which the semiconductor element and the substrate are bonded by using the conductive composition of the present invention, and (a) is a schematic cross-sectional view before heating and (b) is a schematic cross-sectional view after curing by heating.

As shown in FIG. 1(a), the conductive composition 1 is coated onto the substrate 2, and an Si chip (semiconductor element) 3 is mounted onto the conductive composition 1. At this time, in accordance with the number average particle diameter of primary particles of (C) the thermoplastic resin particles 4, a coating thickness of the conductive composition 1 is ensured. As shown in FIG. 1(b), (A) the silver fine particles in the conductive composition 1 are sintered by heating and the bonded portion 10 is formed. A thickness of the bonded portion 10 becomes thinner as compared to the coating thickness due to the volume shrinkage of (A) the silver fine particles, but (C) the thermoplastic resin particles 4 contained in the conductive composition 1 are deformed by melting due to heating, and follows the volume shrinkage of the silver fine particles (A) whereby the bonded portion suppressed in occurrence of the voids can be formed. Also, (C) the thermoplastic resin particles 4 in the bonded portion 10 relaxes the stress applied to the bonded portion 10, crack of the Si chip, crack of the bonded portion 10 itself and peeling at the bonding interface can be suppressed.

Figure 2:
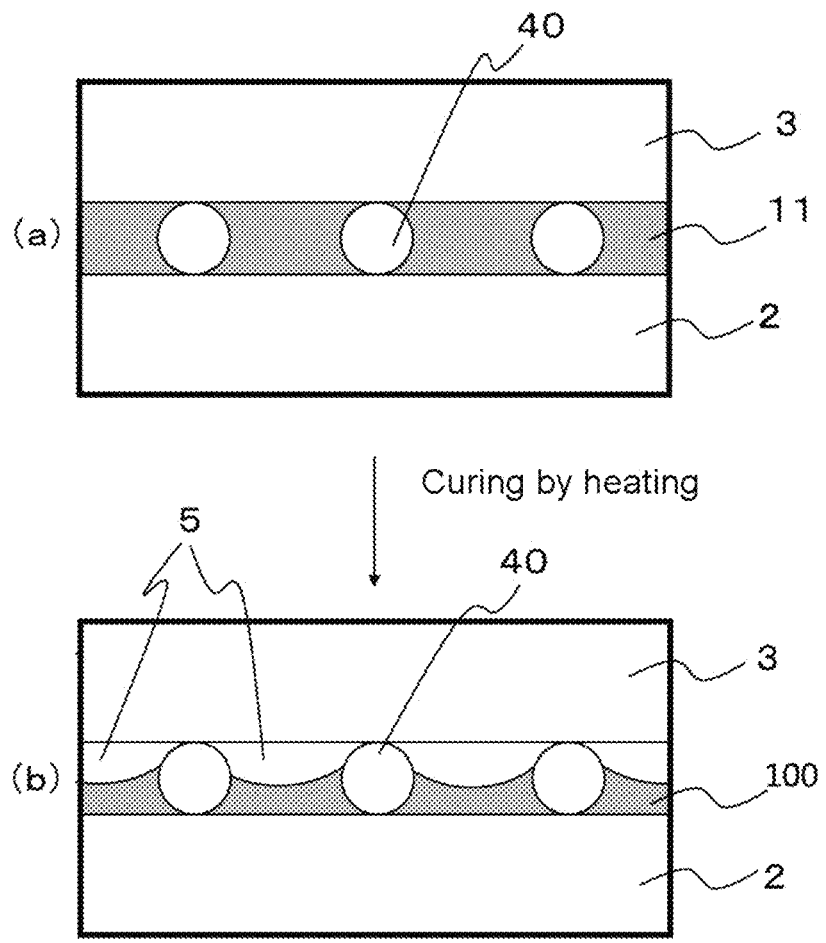
FIG. 2 schematically shows bonded portion according to the conventional example, and (a) is a schematic cross-sectional view before heating and (b) is a schematic cross-sectional view after curing by heating.

FIG. 2 relates to a conventional example, and is a cross-sectional view schematically showing the bonded portion in which the semiconductor element and the substrate are bonded by using a conductive composition containing spherical spacers. The spherical spacers are formed by an acrylic resin, glass, etc., which are not melted at a temperature at which the silver fine particles are sintered. The spherical spacers are contained in the conductive composition to maintain the thickness of the bonded portion formed by the conductive composition.

As shown in FIG. 2(a), the conductive composition 1 containing the spherical spacers is coated onto the substrate 2 to bond the Si chip (semiconductor element) 3 and the substrate 2. As shown in FIG. 2(b), the silver fine particles (A) in the conductive composition 1 are sintered by heating to form a sintered body 100. The sintered body 100 is shrunk in the volume by the sintering of the silver fine particles (A), and the voids 5 are generated between the sintered body 100 of the silver fine particles which had been shrunk in the volume by sintering and the Si chip due to the presence of the spherical spacers 40 which are not deformed. Due to the voids 5, bonding strength of the bonded portion is lowered. Further, moisture, etc., are likely to enter into the voids 5 portions, and moisture, etc., are also to enter into the sintered body 100 of the porous silver fine particles so that the bonded portion is liable to be deteriorated, whereby crack is generated in the Si chip, the sintered body 100 itself may be cracked and interfacial peeling, etc., between the Si chip and the substrate tends to occur.

The thermoplastic resin particles (C) are preferably powder state particles. The thermoplastic resin particles (C) have the number average particle diameter of primary particles on a number basis by the laser diffraction scattering type particle size distribution measurement of preferably 1 µm to 50 µm, more preferably 2 µm to 48 µm, further preferably 3 µm to 45 µm, and particularly preferably 5 µm to 45 µm. The powder state thermoplastic resin particles may have the number average particle diameter of primary particles of the above-mentioned range. If the number average particle diameter of primary particles of the thermoplastic resin particles (C) is 1 µm to 50 µm, the thermoplastic resin particles (C) can be uniformly dispersed in the conductive composition, deform at the time of sintering the silver fine particles to suppress the volume shrinkage at the time of sintering the silver fine particles, and the thickness of the bonded portion can be maintained. In addition, after sintering the silver fine particles in the conductive composition, the stress applied to the bonded portion is relaxed and the bonded portion can be maintained to a desired thickness. Further, if the average particle diameter of the thermoplastic resin (C) is within the above-mentioned range, the stress applied to the bonded portion is relaxed, crack of the semiconductor element which is an object to be adhered, crack at the bonded portion and breakage of the bonding interface, etc., can be suppressed.

A content of the thermoplastic resin particles (C) is preferably 0.1 to 10 parts by mass based on 100 parts by mass of the silver fine particles (A). When the composition contains metal particles (D) mentioned later, the content of the thermoplastic resin particles (C) is preferably 0.1 part by mass to 10 parts by mass based on the total of the silver fine particles (A) and the metal particles (D) as 100 parts by mass. If the content of the thermoplastic resin particles (C) is 0.1 part by mass or more based on 100 parts by mass of the silver fine particles (A) or on the total of the silver fine particles (A) and the metal particles (D) as 100 parts by mass, a coating thickness of the conductive composition can be ensured. In addition, if the content of the thermoplastic resin particles (C) is 10 parts by mass or less based on 100 parts by mass of the silver fine particles (A) or on the total of the silver fine particles (A) and the metal particles (D) as 100 parts by mass, the thermoplastic resin particles are deformed at the time of sintering the silver fine particles and follow the shrinkage at the time of curing the conductive composition, whereby occurrence of the voids at the bonded portion formed by the conductive composition can be suppressed. Further, if the content of the thermoplastic resin particles (C) is 10 parts by mass or less based on 100 parts by mass of the silver fine particles (A) or on the total of the silver fine particles (A) and the metal particles (D) as 100 parts by mass, the modulus of elasticity of the bonded portion formed by the conductive composition can be made small, the stress applied to the bonded portion is relaxed, and crack of the semiconductor element which is an object to be adhered, crack at the bonded portion and breakage of the bonding interface, etc., can be suppressed. The content of the thermoplastic resin particles (C) is preferably 0.1 to 9 parts by mass based on 100 parts by mass of the silver fine particles (A) or on the total of the silver fine particles (A) and the metal particles (D) as 100 parts by mass, more preferably 0.5 to 8 parts by mass.

For example, when the part (semiconductor element) which is an object to be adhered is an LED, the LED is bonded to a ceramic substrate having a small coefficient of thermal expansion (CTE), so that the necessity to relax the stress applied to the bonded portion is low. When the object to be adhered is the LED, the greatest problem at the bonded portion is thermal conductivity rather than stress relaxation. For example, when it is used to a material like the LED which is the object to be adhered where thermal conductivity is the greatest problem, the content of the thermoplastic resin particles (C) is preferably 0.1 to 2 parts by mass based on 100 parts by mass of the silver fine particles (A) or on the total of the silver fine particles (A) and the metal particles (D) as 100 parts by mass. If the content of the thermoplastic resin particles (C) is 2 parts by mass or less, thermal conductivity of the bonded portion formed by the conductive composition can be heightened.

For example, when the part (semiconductor element) which is an object to be adhered is a power MOSFET having a large chip area, stress relaxation as well as the conductivity of the bonded portion becomes a big problem. When such a semiconductor element like a power MOSFET having a large chip area becomes an object to be adhered, the content of the thermoplastic resin particles (C) is preferably exceeding 2 parts by mass and 10 parts by mass or less based on 100 parts by mass of the silver fine particles (A) or on the total of the silver fine particles (A) and the metal particles (D) as 100 parts by mass. If the content of the thermoplastic resin particles (C) exceeds 2 parts by mass and 10 parts by mass or less, it is possible to reduce the modulus of elasticity of the bonded portion so that the bonded portion can be made relatively soft and the effect of relieving the stress applied to the bonded portion can be enhanced. If the content of the thermoplastic resin particles (C) exceeds 10 parts by mass, whereas the effect of reducing the modulus of elasticity of the bonded portion is improved, it is not preferred since the thermal conductivity is low.

The thermoplastic resin constituting the thermoplastic resin particles (C) is preferably at least one kind of the thermoplastic resin selected from the group consisting of polyester, polyurethane, polyimide, polycarbonate and polyolefin (preferably polyethylene and polypropylene). The thermoplastic resin particles (C) comprising such a thermoplastic resin can ensure the coating thickness corresponding to the particle size of the thermoplastic resin particles (C) and also occurrence of the voids can be suppressed by deforming the thermoplastic resin particles (C) at the time of sintering the silver fine particles and follow the shrinkage at the time of sintering of the silver fine particles. Also, the thermoplastic resin particles (C) comprising such a thermoplastic resin can relax the stress applied to the bonded portion and the modulus of elasticity of the bonded portion made low, whereby crack of the semiconductor element which is an object to be adhered, crack at the bonded portion and breakage of the bonding interface, etc., can be suppressed.

[(D) Metal Particles]

The conductive composition of the present invention may further contain (D) metal particles having a number average particle diameter of primary particles of 0.5 µm to 20 µm. The metal particles (D) preferably has a number average particle diameter of primary particles on a number basis by the laser diffraction scattering type particle size distribution measurement of 0.5 µm to 20 µm, more preferably 1 µm to 18 µm, and further preferably 1.4 µm to 15 µm.

Examples of metal constituting the metal particles (D) may be silver (Ag), copper (Cu), nickel (Ni), palladium (Pd), gold (Au), platinum (Pt) and an alloy of these metals, etc. Examples of particles of the alloy may be the metal particles of an alloy constituted by two or more elements selected from the group consisting of Ag, Cu, Ni, Pd, Au and Pt, examples of the binary Ag alloy may be an AgCu alloy, an AgAu alloy, an AgPd alloy, an AgNi alloy, etc., and examples of the ternary Ag alloy may be an AgPdCu alloy, an AgCuNi alloy, etc.

Further, examples of the particles of the alloy may be metal particles which are metal particles of an alloy comprising one or more elements selected from Ag, Cu, Ni, Pd, Au and Pt and one or more other elements, and having a melting point as the alloy of 700° C. or higher. Examples of the other elements may be Zn, Al and Sn, and in the case of the binary alloy of Sn and Ag, an AgSn alloy containing a lager ratio of Ag than the weight ratio of Sn and Ag of 25.5:74.5 can be used. It is also possible to use particles plated with noble metal such as Ag on base metal particles such as Cu and Ni.

The metal particles (D) are preferably Ag or an alloy of Ag in the viewpoints of thermal conductivity, electric conductivity and reliability of the sintered body. The metal particles (D) may be used a single kind alone or two or more kinds in combination. In the metal particles (D) having a number average particle diameter of primary particles of 0.5 µm to 20 µm, no organic material is present onto the surface or around the metal particles (D) different from the silver fine particles (A), so that it has the melting point of the metal constituting the metal particles (D) or the melting point of the alloy. The melting point of the metal particles (D) is higher than the melting point of the silver fine particles (A), and these do not sinter at the temperature at which (A) the metal fine particles sinter. By further adding the metal particles (D) into the conductive composition, the volume shrinkage ratio of the whole conductive composition at the time of sintering can be lowered, the shrinkage stress can be made small, and crack of the objects to be bonded, crack at the bonded portion and peeling at the bonding interface, etc. can be suppressed.

A shape of the metal particles may be any shape such as spherical, flake, scaly, needle-like, etc., and spherical is preferably used since the thickness of the bonded portion can be maintained. Incidentally, the average particle diameter means an average of the particle diameter in the case of spherical shape, the longest part diameter in the case of flake shape, the long diameter of the particle flakes in the case of scaly shape, and the length in the case of needle-like shape.

A content of the metal particles (D) is not particularly limited, and is preferably 10 to 180 parts by mass based on 100 parts by mass of the silver fine particles (A) from the viewpoints of suppressing the volume shrinkage at the time of sintering the conductive composition and improving the thermal conductivity, more preferably 20 to 160 parts by mass, and further preferably 25 to 150 parts by mass.

A total amount of the silver fine particles (A) and the metal particles (D) in the conductive composition is not particularly limited, and is preferably 70% by mass or more in terms of a metal based on 100% by mass of the whole conductive composition from the viewpoint of securing sufficient thermal conductivity, more preferably 72% by mass or more, further preferably 75% by mass or more, preferably 95% by mass or less, more preferably 94% by mass or less, further preferably 92% by mass or less, and particularly preferably 90% by mass or less.

When the total amount of the silver fine particles (A) and the metal particles (D) in the conductive composition is within the above-mentioned range, a desired thickness of the bonded portion can be secured and sufficient thermal conductivity can be secured. In addition, it is possible to reduce the volume shrinkage ratio of the whole conductive composition at the time of sintering, to make the shrinkage stress small, and to suppress crack of the objects to be bonded, crack at the bonded portion and peeling at the bonding interface, etc.

[(E) Thermosetting Resin]

The conductive composition of the present invention may further contain (E) a thermosetting resin, and the thermosetting resin (E) is preferably at least one kind of the thermosetting resin selected from the group consisting of an epoxy resin, a phenol resin and a silicone resin. The thermosetting resin (E) acts as the binder to promote fusion of the silver fine particles with each other and can heighten the thermal conductivity of the bonded portion.

When the conductive composition contains the thermosetting resin (E), while it may vary depending on the kind of the thermosetting resin (E), a content of the thermosetting resin (E) in the conductive composition is preferably 2 to 8 parts by mass based on 100 parts by mass of the silver fine particles (A) or a total of the silver fine particles (A) and the metal particles (D) as 100 parts by mass from the viewpoint of a resin filling ratio into the void portion of the silver sintered body, more preferably 2.5 to 7 parts by mass, and further preferably 3 to 6 parts by mass.

When the thermosetting resin (E) is contained in the conductive composition, it may further contain a curing agent. The curing agent is not particularly limited as long as it can cure the epoxy resin and, for example, a cationic polymerization initiator, an amine-based curing agent, an acid anhydride-based curing agent, a phenolic curing agent, etc., can be used.

The conductive composition of the present invention may contain, within the range which does not impair the effects of the present invention, a curing accelerator (for example, a heterocyclic compound imidazole such as 2-methylimidazole, 2-ethyl-4-methylimidazole, etc., a phosphorus compound such as triphenylphosphine, tetraphenyl phosphonium tetraphenylborate, etc., a tertiary amine such a 2,4,6-tris(dimethylaminomethyl)phenol, benzyldimethylamine, etc., a BBU such as 1,8-diazabicyclo(5,4,0)undecene or a salt thereof, etc., an adduct type promotor in which an amine or an imidazole is adducted by an epoxy, an urea, an acid, etc.), a dispersant (for example, a wetting dispersant such as DISPERBYK101, DISPERBYK102, DISPERBYK103, DISPERBYK106, DISPERBYK111, DISPERBYK116, DISPERBYK142, DISPERBYK180, DISPERBYK192, DISPERBYK2001, DISPERBYK2020, all available from BYK Japan KK, Disperlon PW-36, Disperlon DA-1401, Disperlon DA-550, Disperlon DA-325, Disperlon DA-375, Disperlon DA-234, all available from Kusumoto Chemicals, Ltd., etc.), a surfactant (for example, sorbitan monooleate), a titanate coupling agent (for example, a titanic acid ester such as isopropyltriisostearoyl titanate, etc.), a silane coupling agent, a flame retardant, a levelling agent, a thixotropic agent, a defoaming agent, an ion scavenger, etc.

[Method for Producing Conductive Composition]

The method for producing the conductive composition of the present invention is not particularly limited, and the respective components may be thrown with a predetermined formulation in a mixing apparatus such as a planetary stirrer, a dissolver, a beads mill, a grinding mixer, a pot mill, a three-roll mill, a rotary mixer, a twin-shaft mixer, etc., and mixed to produce the object.

[Electronic Parts]

The conductive composition of the present invention can be printed or applied on a desired portion of a substrate, etc., by the conventionally known method such as screen printing, etc., and thereafter a semiconductor element(s), etc., is/are mounted thereon and sintering it by heating to a predetermined temperature to form a bonded portion, whereby electronic parts can be produced. A heating temperature of the conductive composition can be made 120 to 300° C., preferably 150 to 250° C., and more preferably 180 to 210° C. A heating time may be optionally changed depending on the heating temperature, for example, it can be made 15 to 120 minutes, and preferably 30 to 90 minutes. Sintering may be carried out in an inert gas such as a nitrogen atmosphere or in the air. An apparatus for the sintering may be, for example, a conventionally known electric furnace, a fan dryer, a belt furnace, etc.

The bonded portion formed by using the conductive composition of the present invention forms a silver film. The silver film which becomes the bonded portion has sufficient mechanical strength, and thermal cycle characteristics or durability is good so that it is excellent in the point of reliability. The silver film also has a sufficient electric conductivity of an electric resistivity of 3 to 25 µΩ·cm, and has high thermal conductivity included in the range of 20 to 150 W/mK. The silver film which becomes the bonded portion has the electric resistivity of preferably 5 to 22 µΩ·cm, more preferably 8 to 20 µΩ·cm. The silver film which becomes the bonded portion also has the thermal conductivity of preferably 25 to 120 W/mK, more preferably 27 to 110 W/mK. The conductive composition of the present invention can be used for forming a conductive circuit on a printed circuit board, an electrode of a capacitor, etc., and by taking advantage of the above-mentioned characteristics, it can be suitably used for bonding parts of the electronic parts such as the semiconductor device, etc., and the substrate and parts, etc.

The conductive composition of the present invention is particularly suitable for application as a die attach material of the bonded portion of the semiconductor device as electronic parts. Lead solder has widely been used as the die attach material, but due to the harmfulness of lead, restrictions in use of lead in each country are becoming more severe. The die attach material obtained by using the thermally conductive paste of the present invention shows the thermal conductivity equal to or higher than the thermal conductivity of lead (in general, 35 to 65 W/mK), and has good electric conductivity, so that it can be a die attach material having high thermal conductivity, which can be an alternative to lead solder. The conductive composition of the present invention is suitable, for example, as a die attach material for forming a bonded portion for bonding a silicon die as a semiconductor device. In addition to the silicon die, various materials, for example, such as SiC and GaN, etc., can be used.

Further, according to the conductive composition of the present invention, it is possible to obtain a strong bonding strength only by heating in the bonding process without applying a pressure, provided that pressurization may be carried out.

When the size of the chip of the semiconductor element is as small as, for example, 0.1 to 10 mm², it is difficult to pressurize, and it is also difficult to control the thickness of the bonded portion by pressurization. According to the conductive composition of the present invention, volume shrinkage due to sintering of the silver fine particles is suppressed by the thermoplastic resin particles, and the desired thickness of the bonded portion can be ensured without controlling the thickness of the bonded portion by pressurization. Further, according to the conductive composition of the present invention, a stress applied to the bonded portion is relaxed by the thermoplastic resin particles in the silver film obtained by sintering the silver fine particles, whereby crack of the semiconductor element, crack of the bonded portion itself and peeling of the bonding interface, etc., can be suppressed.

The conductive composition of the present invention is also suitable in the application as the bumps of a bonded member of the semiconductor device.

EXAMPLES

In the following, the present invention is explained in detail by referring to Examples, but the present invention is not limited by these.

Analyses in Examples were carried out as follows.

(1) Measurement Regarding Silver Fine Particles and Metal Particles (1-1) Number Average Particle Diameter To 50 cc of a dispersing water (0.5% AEROSOL containing water available from Beckman Coulter Inc.) is added 0.5 g of silver fine particles or 0.5 g of metal particles, and the mixture is dispersed by an ultrasonic wave disperser for 5 minutes. A number average particle diameter of the dispersed sample was measured by a laser diffraction scattering type particle size distribution measurement (LS230 manufactured by Beckman Coulter Inc.). The number average particle diameter of primary particles was obtained on a number basis.

(1-2) Crystallite Diameter

The silver fine particles were measured by an X-ray diffraction measurement device (M18XHF22) manufactured by MAC SCIENCE, to obtain a full width at half maximum intensity of index (1,1,1) plane with an Cu Kα ray as a radiation source, and the crystallite diameter was calculated from the Scherrer's equation.

(1-3) Sinterability

The silver fine particles were retained under the temperature condition of 200° C. for 20 minutes to 2 hours by a fan dryer and whether the particles alone were sintered or not was confirmed by a field emission type scanning electron microscope (JSM7500F) manufactured by JEOL Ltd.

(2) Measurement with Regard to Thermoplastic Resin Particles (2-1) Number Average Particle Diameter To 50 cc of a dispersing water (AEROSOL 0.5% containing water) was added 2 g of the thermoplastic resin particles (powder resin), and the mixture was dispersed by an ultrasonic wave disperser for 5 minutes to prepare a sample. The sample was applied to a laser diffraction scattering type particle size distribution measurement (LS230 manufactured by Beckman Coulter Inc.) to measure the number average particle diameter. The number average particle diameter of primary particles was obtained on a number basis.

(2-2) Measurement in Differential Scanning Calorimetry 10 mg of the thermoplastic resin particles (powder resin) was measured by a differential scanning calorimeter (Model No.: DSC204 F1 Phoenix) manufactured by NETZSCH-Gerätebau GmbH. The measurement temperature range is made 25° C. or higher and 300° C. or lower, and the temperature range in which the maximal value of the endothermic peak exists is obtained from the DSC curve of the measured sample obtained by measuring with a temperature raising rate of 10° C./min under normal temperature and normal relative humidity.

(3) Measurement Concerning Conductive Composition

The sample was prepared as follows.

The conductive composition was coated onto the slide glass substrate with a size of 0.5 cm×5.0 cm and a thickness of 100 μm, and by using a fan dryer, the temperature thereof was raised from the room temperature (25° C.) to 200° C. over 60 minutes and retained at 200° C. for 60 minutes to carry out sintering to obtain a silver film. This was made a sample for various analyses.

(3-1) Electric Resistivity (μΩ·cm)

The conductive composition was coated onto the slide glass with a width of 0.5 cm, a length of 5.0 cm and a thickness of 100 μm, and by using a fan dryer, heating was started from the room temperature (25° C.) with a temperature raising rate of 3° C./min and when the temperature reached to 200° C., heating was continued for further one hour while maintaining the temperature to 200° C. Thereafter, a film thickness of the obtained silver film was measured by using a surface roughness form measuring device (SURFCOM 300B) manufactured by TOKYO SEIMITSU Co., Ltd., and then, electric resistance was measured by using a multimeter (Type 2001 (memory 128K)) manufactured by TOYO Corporation with the four-terminal method. The electric resistivity was obtained from the film thickness and the electric resistance of the film after curing by heating.

(3-2) Thermal Conductivity (W/m·K)

The conductive composition was coated onto the slide glass with a coating thickness of 1 to 2 mm, and in such a state, heating was started by a fan dryer from the room temperature (25° C.) with a temperature raising rate of 3° C./min, and when the temperature reached to 200° C., heating was continued for further one hour while maintaining the temperature to 200° C. After completion of the heating, it was sufficiently cooled to the room temperature (25° C.), and the silver film formed onto the slide glass was peeled off from the slide glass. With regard to the thus obtained silver film, thermal conductivity was measured by the laser flash method (Xe flash analyzer manufactured by NETZSCH-Gerätebau GmbH) to obtain the value of the thermal conductivity.

(3-3) Measurement of Modulus of Elasticity (GPa)

The conductive composition was coated onto the slide glass onto which a releasing agent had been coated with a width of 0.5 cm, a length of 4.0 cm and a thickness of 350 μm, and by using a fan dryer, heating was started from the room temperature (25° C.) with a temperature raising rate of 3° C./min and when the temperature reached to 200° C., heating was continued for further one hour while maintaining the temperature to 200° C. After completion of the heating, it was sufficiently cooled to the room temperature (25° C.), and the silver film formed onto the slide glass was peeled off from the slide glass. With regard to the thus obtained silver film, a tensile elastic modulus at the room temperature (25° C.) was measured by using a viscoelasticity measuring apparatus (DMS6100, manufactured by SII Nano Technology Inc.). Incidentally, the measurement was carried out with n=3, and the average value was made an inspection value. Also, the film thickness and the width of the test piece were measured at five points and the average value thereof was used for the calculation.

(3-4) Evaluation of Voids

The conductive composition was coated onto a copper lead flame subjected to silver plating with a width of 3 cm, a length of 3 cm and a thickness of 100 μm, and a silicon chip (gold back coating semiconductor chip 3 mm×3 mm) was mounted thereon. After controlling the coating thickness to 50 μm by applying a load, heating was started by a batch-type heating furnace with a temperature raising rate of 3° C./min and when the temperature reached to 200° C., heating was continued for further one hour while maintaining the temperature to 200° C. After completion of the heating, by cooling to the room temperature, a test piece for evaluation in which the bonded portion had been formed by the conductive composition was prepared. The thus obtained test piece was observed from the upper surface of the silicon chip by an X-ray inspection device (Model No.: XD7600NT) manufactured by Nordson DAGE, and the image was subjected to the binarization processing to divide the voids (space portion) and the portion at which no void exists, and the value (a void ratio) of the portion at which the voids (space) exist were calculated from the entire image. The void ratio of less than 5% was judged as ○, and 5% or more as x.

(3-5) Observation of Cross-Section of Bonded Portion

The conductive composition was coated onto a copper lead flame subjected to silver plating, the silicon chip (gold back coating semiconductor chip 2 mm×2 mm) was mounted thereon. After controlling the coating thickness to 50 μm by applying a load, heating was started by a batch-type heating furnace with a temperature raising rate of 3° C./min and when the temperature reached to 200° C., heating was continued for further one hour while maintaining the temperature to 200° C. After completion of the heating, the substrate for evaluation was cooled to the room temperature. Then, it was impregnated in a molding resin (SpeciFix Resin/SpeciFix-20 Curing Agent) available from Struers, and the molding resin was cured to prepare a sample. The sample was cut so as to be perpendicular to the bonding surface between the silicon chip and the lead frame, and after the surface of the cut face was smoothened by grinding, carbon was vapor deposited and observation of the cross-section was carried out by a field emission type scanning electron microscope (JSM7500F) manufactured by JEOL Ltd., with a magnification of 100-fold to 50,000-fold.

(3-6) Die Shear Strength (Bonding Strength)

The conductive composition was coated onto a copper lead flame subjected to silver plating, the silicon chip (gold back coating semiconductor chip 2 mm×2 mm) was mounted thereon. After controlling the coating thickness to 50 μm by applying a load, heating was started by a batch-type heating furnace with a temperature raising rate of 3° C./min and when the temperature reached to 200° C., heating was continued for further one hour while maintaining to 200° C. After completion of the heating, a test piece for evaluation was prepared by cooling to the room temperature. With regard to the test piece for evaluation, measurements of die shear strength of the test piece for evaluation was carried out at the room temperature and at 260° C. by a universal bond tester (Series 4000) manufactured by Dage Japan Co., Ltd.

(3-7) Evaluation of Reliability: Thermal Cycling Test

The conductive composition was coated onto a copper lead flame subjected to silver plating with a width of 3 mm, a length of 3 mm and a thickness of 100 μm, and a silicon chip (gold back coating semiconductor chip 3 mm×3 mm) was mounted thereon. After coating the conductive composition while controlling the coating thickness to 50 μm by applying a load, heating was started by a batch-type heating furnace with a temperature raising rate of 3° C./min from the room temperature and when the temperature reached to 200° C., heating was continued for further one hour while maintaining to 200° C. After completion of the heating, a test piece for evaluation in which the bonded portion has been formed by the conductive composition was prepared by cooling it to the room temperature (25° C.). The test piece thus obtained was placed in a small sized thermal shock testing device (TSE-11) manufactured by ESPEC CORPORATION, subjected to a thermal shock test with 1000 cycles in which standing at −55° C. for 5 minutes and standing at +150° C. for 5 minutes as one cycle, and cross-sectional observation was carried out by a field emission type scanning electron microscope (JSM7500F) manufactured by JEOL Ltd., whether there is cracks or peeling at the bonded portion or not.

The respective components used in Examples are as follow.

<(A) Silver Fine Particles>

Silver Fine Particles a

In 10 L of a reaction apparatus made of glass was charged 3.0 kg (30.9 mol) of 3-methoxypropylamine. Under stirring, 5.0 kg (30.0 mol) of silver acetate was added thereto while retaining the reaction temperature to 45° C. or lower. Immediately after the addition, the mixture was a transparent solution and the added material was dissolved, but with the progress of the addition, the solution gradually became cloudy and when the whole amount was added, the mixture became ash brown turbid colored viscous liquid. To the liquid was gradually added dropwise 1.0 kg (21.0 mol) of 95% by weight formic acid. Vigorous heat generation was observed immediately after the dropwise addition, but during which the reaction temperature was maintained at 30 to 45° C. Initially, the ash turbid viscous liquid changed from brown to black. The reaction was terminated after the whole amount was dropped in. When the reaction mixture was allowed to stand at 40° C., it separated into two layers. The upper layer was a yellow transparent liquid, and black silver fine particles precipitated in the lower layer. The upper layer liquid did not contain the silver component. The upper layer liquid was removed by decantation, and the layers were separated by using methanol, and then the upper layer liquid was again removed by decantation. Then, 0.3 kg (1.9 mol) of dihydroterpineol was added, and the residual methanol was distilled off under reduced pressure by a rotary evaporator (Model N-3010) manufactured by TOKYO RIKAKIKAI Co., Ltd., to obtain a silver fine particles-containing paste with the content of the silver fine particles of 90% by mass. The characteristics of the silver fine particles are as follows. In Table 1, (A) the silver fine particles a represents a formulation ratio (parts by mass) of the silver fine particles-containing paste with the content of the silver fine particles of 90% by mass in the resin composition. (i) The silver fine particles a had a number average particle diameter of primary particles of 61 nm, a crystallite diameter of 40 nm and an average particle diameter/the crystallite diameter of 1.5 (the average particle diameter/the crystallite diameter=1.5). (ii) When the silver fine particles in the silver fine particles a-containing paste were sintered at a temperature of 200° C. for 20 minutes by a fan dryer, the solvent, etc., in the paste were volatilized and the silver fine particles a were sintered. Whether or not the particles were sintered was confirmed by a field emission type scanning electron microscope (JSM7500F) manufactured by JEOL Ltd.

Silver Fine Particles b (i) Silver fine particles b had a number average particle diameter of primary particles of 40 nm to 400 nm.

(ii) Silver fine particles b were confirmed to be not sintered by alone when the particles were retained under the temperature condition of 180 to 250° C. by a fan dryer for 20 minutes to 2 hours using a field emission type scanning electron microscope (JSM7500F) manufactured by JEOL Ltd.

Silver Fine Particles c (i) Silver fine particles c had a number average particle diameter of primary particles exceeding 400 nm.

(ii) Silver fine particles c were confirmed to be not sintered by alone when the particles were retained under the temperature condition of 180 to 250° C. by a fan dryer for 20 minutes to 2 hours using a field emission type scanning electron microscope (JSM7500F) manufactured by JEOL Ltd.

<(B) Solvent>

Diethylene glycol monobutyl ether acetate (available from YONEYAMA YAKUHIN KOGYO CO., LTD., boiling point: 245° C.)

2-Ethyl-1,3-hexane diol (available from KANTO CHEMICAL CO., INC., boiling point: 244° C.)

2,2,4-Trimethyl-1,3-pentane diol 2-methylpropanoate (available from KANTO CHEMICAL CO., INC., boiling point: 261° C.)

<(C) Thermoplastic Resin Particles>

Thermoplastic resin particles a: FIX376 (polyester resin) (available from Schaetti AG), a number average particle diameter of primary particles 20 to 25 μm, the maximal value of the endothermic peak in the DSC chart exists in the range of 110° C. to 130° C.

Thermoplastic resin particles b: FIX3110 (polyester resin) (available from Schaetti AG), a number average particle diameter of primary particles 20 to 25 μm, the maximal value of the endothermic peak in the DSC chart exists in the range of 110° C. to 140° C.

Thermoplastic resin particles c: Maxbond133 (polyester resin) (available from PCRG), a number average particle diameter of primary particles 3 to 6 μm, the maximal value of the endothermic peak in the DSC chart exists in the range of 50° C. to 75° C.

Thermoplastic resin particles d: Ulterm Resin 1000 (polyether imide resin) (available from SABIC), a number average particle diameter of primary particles 15 to 20 μm, the maximal value of the endothermic peak in the DSC chart does not exist in the range of 25° C. to 300° C.

Thermoplastic resin particles e: Ulterm Resin STM1500 (siloxane polyetherimide block copolymer) (available from SABIC), a number average particle diameter of primary particles 10 to 15 μm, the maximal value of the endothermic peak in the DSC chart does not exist in the range of 25° C. to 300° C.

Thermoplastic resin particles f: FIX6220 (polyurethane resin) (available from Schaetti AG), a number average particle diameter of primary particles 20 to 25 μm, the maximal value of the endothermic peak in the DSC chart exists in the range of 115° C. to 135° C.

Thermoplastic resin particles g: Orgasol3501 (polyamide resin) (available from ARKEMA Inc.), a number average particle diameter of primary particles 8 to 12 μm, the maximal value of the endothermic peak in the DSC chart exists in the range of 140° C. to 160° C.

Thermoplastic resin particles h: PD powder (polyolefin resin) (available from MTEC Chemical Co., Ltd.), a number average particle diameter of primary particles 10 to 20 μm, the maximal value of the endothermic peak in the DSC chart exists in the range of 80° C. to 120° C.

Thermoplastic resin particles i: PPW-5 (polypropylene resin) (available from SEISHIN ENTERPRISE Co., Ltd.), a number average particle diameter of primary particles 5 to 15 μm, the maximal value of the endothermic peak in the DSC chart exists in the range of 130° C. to 160° C.

Thermoplastic resin particles j: PM200 (polyethylene resin) (available from Mitsui Chemicals, Inc.), a number average particle diameter of primary particles 10 to 20 μm, the maximal value of the endothermic peak in the DSC chart exists in the range of 130° C. to 150° C.

Figure 11:
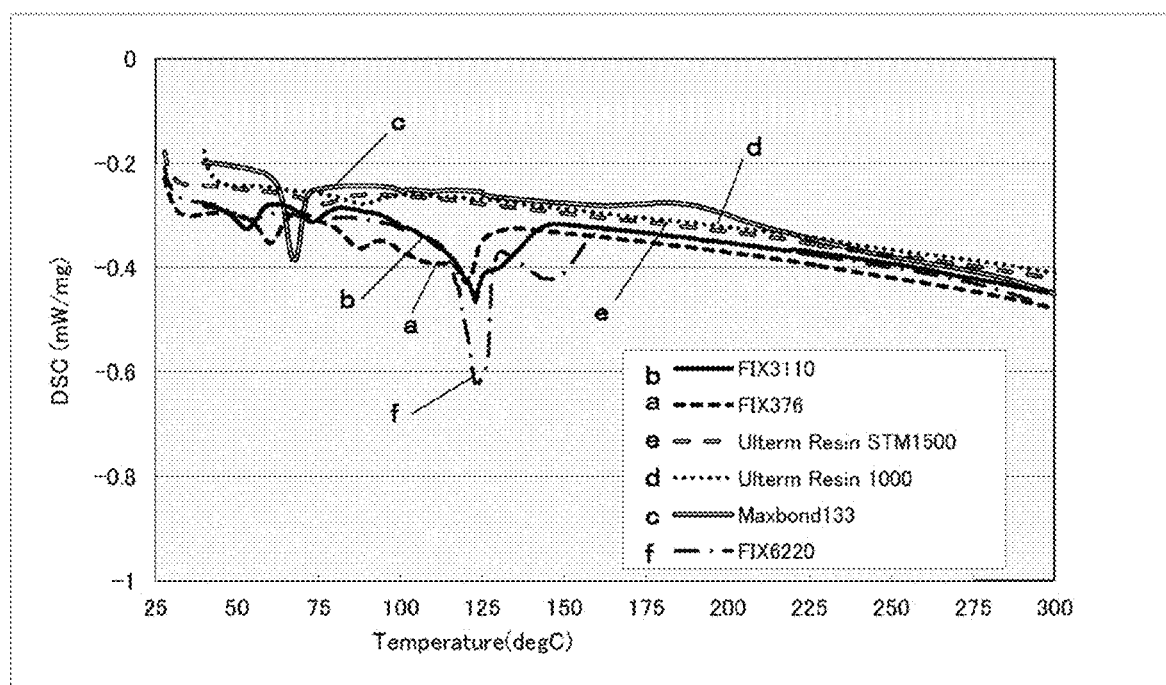
FIG. 11 shows a DSC chart obtained by measurements using a differential scanning calorimeter of various kinds of the thermoplastic resin particles.
Figure 12:
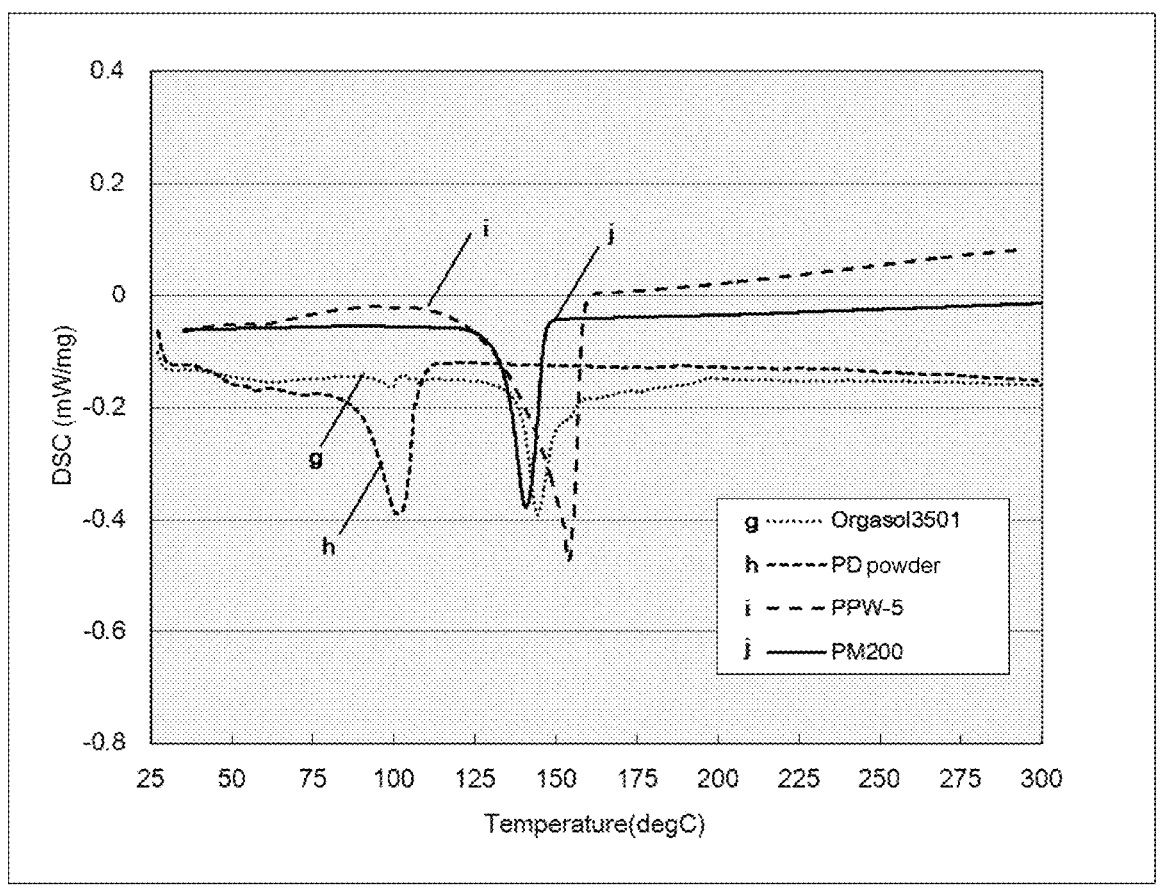
FIG. 12 shows a DSC chart obtained by measurements using a differential scanning calorimeter of various kinds of the thermoplastic resin particles.

FIG. 11 shows a DSC chart of the thermoplastic resin particles a to f by a differential scanning calorimeter (Model No.: DSC204 F1 Phoenix) manufactured by NETZSCH-Gerätebau GmbH. FIG. 12 shows a DSC chart of the thermoplastic resin particles g to j by a differential scanning calorimeter (Model No.: DSC204 F1 Phoenix) manufactured by NETZSCH-Gerätebau GmbH.

<(D) Metal Particles>

Silver particles d: as the metal particles (D), spherical silver particles d having a number average particle diameter of primary particles of 1.4 μm were used. The melting point of the silver particles is 961° C.

<(E) Thermosetting Resin>

Liquid state epoxy resin a: AK601: Hexahydrophthalic acid glycidyl ester

<Curing Agent>

Cationic polymerization initiator: 4-Methylphenyl[4-(1-methylethyl)phenyl]iodonium=tetrakis(pentafluorophenyl)borate (iodonium salt-based initiator (RHODORSIL 2074)) (available from Rhodia Inc.)

<Dispersant>

DISPERBYK111 (available from BYK Japan KK)

<Spacer>

Spherical resin beads (Micropearl SP-215) (available from SEKISUI CHEMICAL CO., LTD.), the average particle diameter of the primary particles is 20 μm The conductive compositions of Examples, Reference example and Comparative examples were prepared by formulating the components shown in the following Table 1 with the formulation shown in the following Table 1, followed by stirring by a hybrid mixer and defoaming to make the composition uniform. By using these conductive compositions, various characteristics were measured by the above-mentioned test methods. The formulation shown in Table 1 is part(s) by mass. The results of the various characteristics are shown in Table 1.

TABLE 1

| | | | Reference example 1 | Example 1 | Example 2 | Example 3 | Example 4 | Example 5 |
|---|---|---|---|---|---|---|---|---|
| (A) Silver fine particles | Silver fine particles a | Sintered at 180 to 250° C. | 100 | 100 | 100 | 100 | 100 | 100 |
| | Silver fine particles b | Sintered at a temperature exceeding 250° C. | — | — | — | — | — | — |
| | Silver fine particles c | Sintered at a temperature exceeding 250° C. | — | — | — | — | — | — |
| (D) Metal particles | | Silver particles d | — | — | — | — | — | — |
| (B) Solvent | | Diethylene glycol monobutyl ether acetate | 3.0 | 3.0 | 3.0 | 3.0 | 3.0 | 3.0 |
| (C) Thermoplastic resin particles | a: FIX376 | 110° C.~130° C. | — | 2.0 | 4.0 | 8.0 | 8.0 | — |
| | b: FIX3110 | 110° C.~140° C. | — | — | — | — | — | 6.0 |
| | c: MAXbond133 | 50° C.~75° C. | — | — | — | — | — | — |

TABLE 1-continued

|  |  |  | | | | | | |
|---|---|---|---|---|---|---|---|---|
|  | d: Ultem Resin 1000 | No maximal value of endothermic peak | — | — | — | — | — | — |
|  | e: Ultem Resin STM1500 | No maximal value of endothermic peak | — | — | — | — | — | — |
|  | f: FIX6220 | 115° C.~135° C. | — | — | — | — | — | — |
| (E) Thermosetting resin | Hexahydrophthalic acid glycidyl ester | | 5.0 | 5.0 | 5.0 | 5.0 | 5.0 | 5.0 |
| Curing agent | 4-Methylphenyl[4-(1-methyl-ethyl)]phenyl]iodonium-tetrakis(pentafluorophenyl)-borate | | 0.3 | 0.3 | 0.3 | 0.3 | 0.3 | 03 |
| Dispersant | DISPERBYK111 | | 0.4 | 0.4 | 0.4 | 0.4 | 0.4 | 0.4 |
| Spacer | Micropearl SP-215 | | 2.0 | — | — | — | — | — |
| Electric resistivity (μΩ·cm) | | | 8.3 | 9.5 | 11 | 14 | 19 | 15 |
| Die shear strength (MPa) | Room temperature | | 15 | 47 | 50 | 45 | 38 | 43 |
|  | 260° C. | | 8 | 18 | 18 | 10 | 6 | 10 |
| Thermal conductivity (W/mK) | | | 120 | 100 | 80 | 50 | 33 | 45 |
| Modulus of elasticity (GPa) | | | 15 | 9 | 8 | 5 | 4 | 5 |
| Voids | | | X | ○ | ○ | ○ | ○ | ○ |
| Thermal shock cycle test | Die crack | | Present | None | None | None | None | None |
|  | Peeling | | Present | Slightly present | None | None | None | None |

| | | | Example 6 | Example 7 | Example 8 | Example 9 | Example 10 | Example 11 |
|---|---|---|---|---|---|---|---|---|
| (A) Silver fine particles | Silver fine particles a | Sintered at 180 to 250° C. | 100 | 100 | 100 | 80 | 60 | 40 |
|  | Silver fine particles b | Sintered at a temperature exceeding 250° C. | — | — | — | — | — | — |
|  | Silver fine particles c | Sintered at a temperature exceeding 250° C. | — | — | — | — | — | — |
| (D) Metal particles | Silver particles d | | — | — | — | 20 | 40 | 60 |
| (B) Solvent | Diethylene glycol monobutyl ether acetate | | 3.0 | 3.0 | 3.0 | 3.0 | 3.0 | 3.0 |
| (C) Thermoplastic resin particles | a: FIX376 | 110° C.~130° C. | — | 10.0 | 2.0 | 4.0 | 4.0 | 4.0 |
|  | b: FIX3110 | 110° C.~140° C. | — | — | — | — | — | — |
|  | c: MAXbond133 | 50° C.~75° C. | — | — | — | — | — | — |
|  | d: Ultem Resin 1000 | No maximal value of endothermic peak | — | — | — | — | — | — |
|  | e: Ultem Resin STM1500 | No maximal value of endothermic peak | — | — | — | — | — | — |
|  | f: FIX6220 | 115° C.~135° C. | 8.0 | — | — | — | — | — |
| (E) Thermosetting resin | Hexahydrophthalic acid glycidyl ester | | 5.0 | 5.0 | — | 5.0 | 5.0 | 5.0 |
| Curing agent | 4-Methylphenyl[4-(1-methyl-ethyl)]phenyl]iodonium-tetrakis(pentafluorophenyl)-borate | | 0.3 | 0.3 | — | 0.3 | 0.3 | 0.3 |
| Dispersant | DISPERBYK111 | | 0.4 | 0.4 | 0.4 | 0.4 | 0.4 | 0.4 |
| Spacer | Micropearl SP-215 | | — | — | — | — | — | — |
| Electric resistivity (μΩ·cm) | | | 16 | 25 | 10.2 | 10.2 | 9.2 | 9.6 |
| Die shear strength (MPa) | Room temperature | | 44 | 26 | 43 | 44 | 50 | 46 |
|  | 260° C. | | 11 | 4 | 17 | 17 | 19 | 18 |
| Thermal conductivity (W/mK) | | | 40 | 25 | 95 | 80 | 85 | 83 |
| Modulus of elasticity (GPa) | | | 6 | 3 | 9 | 7 | 8 | 7 |
| Voids | | | ○ | ○ | ○ | ○ | ○ | ○ |
| Thermal shock cycle test | Die crack | | None | None | None | None | None | None |
|  | Peeling | | None | None | Slightly present | None | None | None |

| | | | Comparative example 1 | Comparative example 2 | Comparative example 3 | Comparative example 4 | Comparative example 5 |
|---|---|---|---|---|---|---|---|
| (A) Silver fine particles | Silver fine particles a | Sintered at 180 to 250° C. | 100 | 100 | 100 | 100 | — |
|  | Silver fine particles b | Sintered at a temperature exceeding 250° C. | — | — | — | — | — |
|  | Silver fine particles c | Sintered at a temperature exceeding 250° C. | — | — | — | — | 100 |
| (D) Metal particles | Silver particles d | | — | — | — | — | — |
| (B) Solvent | Diethylene glycol monobutyl ether acetate | | 3.0 | 3.0 | 3.0 | 3.0 | 3.0 |
| (C) Thermoplastic resin particles | a: FIX376 | 110° C.~130° C. | — | — | — | — | 6.0 |
|  | b: FIX3110 | 110° C.~140° C. | — | — | — | — | — |
|  | c: MAXbond133 | 50° C.~75° C. | — | — | 8.0 | — | — |
|  | d: Ultem Resin 1000 | No maximal value of endothermic peak | — | — | — | 6.0 | — |
|  | e: Ultem Resin STM1500 | No maximal value of endothermic peak | — | — | — | 6.0 | — |
|  | f: FIX6220 | 115° C.~135° C. | — | — | — | — | — |

TABLE 1-continued

| | | | | | | |
|---|---|---|---|---|---|---|
| (E) Thermosetting resin | Hexahydrophthalic acid glycidyl ester | 5.0 | 5.0 | 5.0 | 5.0 | 5.0 |
| Curing agent | 4-Methylphenyl[4-(1-methyl-ethyl)]phenyl]iodonium-tetrakis(pentafluorophenyl)-borate | 0.3 | 0.3 | 0.3 | 0.3 | 0.3 |
| Dispersant | DISPERBYK111 | 0.4 | 0.4 | 0.4 | 0.4 | 0.4 |
| Spacer | Micropearl SP-215 | — | — | — | — | — |
| Electric resistivity (μΩ · cm) | | 6.2 | 153 | 15 | 16 | 250 |
| Die shear strength (MPa) | Room temperature | 6 | 21 | 32 | 26 | 15 |
| | 260° C. | 3 | 3 | 20 | 15 | 1 |
| Thermal conductivity (W/mK) | | 165 | 9 | 80 | 75 | 2 |
| Modulus of elasticity (GPa) | | 26 | 8 | 12 | 11 | 1 |
| Voids | | ○ | ○ | X | X | ○ |
| Thermal shock cycle test | Die crack | None | None | None | None | None |
| | Peeling | Present | None | Present | Present | None |

TABLE 2

| | | | Example 12 | Example 13 | Example 14 | Example 15 | Example 16 | Example 17 |
|---|---|---|---|---|---|---|---|---|
| (A) Silver fine particles | Silver fine particles a | Sintered at 180 to 250° C. | 100 | 100 | 100 | 100 | 100 | 100 |
| | Silver fine particles b | Sintered at a temperature exceeding 250° C. | — | — | — | — | — | — |
| | Silver fine particles c | Sintered at a temperature exceeding 250° C. | — | — | — | — | — | — |
| (D) Metal particles | Silver particles d | | — | — | — | — | — | — |
| (B) Solvent | a: Diethylene glycol monobutyl ether acetate | | 3.0 | 3.0 | 3.0 | 3.0 | — | — |
| | b: 2-Ethyl-1,3-hexane diol | | — | — | — | — | 3.0 | — |
| | c: 2,2,4-Trimethyl-1,3-pentane diol 2-methylpropanoate | | — | — | — | — | — | 3.0 |
| (C) Thermoplastic resin particles | a: FIX376 | 110° C.~130° C. | — | — | — | — | 6.0 | 6.0 |
| | b: FIX3110 | 110° C.~140° C. | — | — | — | — | — | — |
| | c: MAXbond133 | 50° C.~75° C. | — | — | — | — | — | — |
| | d: Ultem Resin1000 | No maximal value of endothermic peak | — | — | — | — | — | — |
| | e: Ultem ResinSTM1500 | No maximal value of endothermic peak | — | — | — | — | — | — |
| | f: FIX6220 | 115° C.~135° C. | — | — | — | — | — | — |
| | g: Orgasol3501 | 140° C.~160° C. | 6.0 | — | — | — | — | — |
| | h: PD powder | 80° C.~120° C. | — | 6.0 | — | — | — | — |
| | i: PPW-5 | 130° C.~160° C. | — | — | 6.0 | — | — | — |
| | j: PM200 | 130° C.~50° C. | — | — | — | 6.0 | — | — |
| (E) Thermosetting resin | Hexahydrophthalic acid glycidyl ester | | 5 | 5 | 5 | 5 | 5 | 5 |
| Curing agent | 4-Methylphenyl[4-(1-methyl-ethyl)]phenyl]iodonium-tetrakis-(pentafluorophenyl)borate | | 0.3 | 0.3 | 0.3 | 0.3 | 0.3 | 0.3 |
| Dispersant | DISPERBYK111 | | 0.4 | 0.4 | 0.4 | 0.4 | 0.4 | 0.4 |
| Spacer | Micropearl SP-215 | | — | — | — | — | — | — |
| Electric resistivity (μΩ · cm) | | | 11 | 12 | 11 | 13 | 14 | 13 |
| Die share strength (Mpa) | Room temperature | | 46 | 52 | 45 | 43 | 46 | 45 |
| | 260° C. | | 12 | 10 | 8 | 7 | 11 | 11 |
| Thermal conductivity (W/mK) | | | 56 | 62 | 63 | 60 | 53 | 52 |
| Modulus of elasticlty (GPa) | | | 6 | 7 | 7 | 8 | 5 | 4 |
| Voids | | | ○ | ○ | ○ | ○ | ○ | ○ |
| Thermal shock cycle test | Die crack | | None | None | None | None | None | None |
| | Peeling | | None | None | None | None | None | None |

As shown in Table 1 and Table 2, the bonded portion formed by using the conductive compositions of Examples 1 to 17 were excellent in bonding strength (die shear strength), suppressed in generation of voids, and had low electric resistivity, high thermal conductivity and low modulus of elasticity. Also, the bonded portion formed by using the conductive compositions of Examples 2 to 6 and Examples 12 to 17 had neither die crack nor peeling, etc. As in the conductive composition of Examples 1, when the content of the thermoplastic resin particles (C) was 2 parts by mass, the thermal conductivity at the bonded portion formed by using the conductive composition was high as 100 W/mK. As in the conductive compositions of Examples 2 to 7, when the content of the thermoplastic resin particles (C) was in excess of 2 parts by mass and 10 parts by mass or less, the modulus of elasticity at the bonded portion became small, and crack of the semiconductor element, crack of the bonded portion itself and peeling of the bonding interface can be prevented by relaxing the stress applied to the bonded portion, whereby it could be confirmed that it can be suitably used for the object to be adhered being a part such as a power MOSFET having a large chip area, etc. As in the conductive composition of Examples 8, when the conductive composition does not contain any thermosetting resin (E), it could be confirmed that slight peeling was admitted at the bonded portion after subjected to the thermal cycling test of 1,000 cycles which were repeated the cycle of −55° C. to 150° C.

The bonded portions formed by using the conductive compositions containing the silver fine particles (A) and the metal particles (D) as in Examples 9 to 11 were excellent in bonding strength (die shear strength) at both of room temperature and high temperature (260° C.), suppressed in occurrence of voids, and had excellent thermal conductivity while maintaining the electric resistivity and the modulus of elasticity to low degrees. The bonded portions formed by using the conductive compositions of Examples 9 to 11 were observed neither die crack nor peeling after the thermal cycling test.

On the other hand, the bonded portions formed by using the conductive compositions of Comparative examples 1, 3 and 4 had a high modulus of elasticity and became rigid, and die crack or peeling occurred after the temperature cycle test. The conductive composition of Comparative example 1 neither contains the spacer nor the thermoplastic resin particles, so that the modulus of elasticity became the highest among Comparative examples, bonding strength (die shear strength) was lowered and peeling occurred. The bonded portion formed by using the conductive composition of Comparative example 2 had a relatively low modulus of elasticity, but the bonding strength at high temperature was lowered and the thermal conductivity was also lowered. Whereas the conductive composition of Comparative example 2 contains the thermoplastic resin particles (C), the thermoplastic resin particles (C) were a material having the maximal value of the endothermic peak in the DSC chart obtained by the measurement using the differential scanning calorimeter of in the range of less than 80° C., so that the particles were melted before starting the sintering to inhibit the sintering whereby the electric resistivity was increased and the thermal conductivity was lowered. The conductive compositions of Comparative examples 3 and 4 contain the thermoplastic resin particles (C), but the thermoplastic resin particles (C) had no maximal value of the endothermic peak in the DSC chart obtained by the measurement using the differential scanning calorimeter in the range of 25° C. to 300° C., so that the thermoplastic resin particles could not follow the volume shrinkage of the silver fine particles at the time of sintering, whereby occurrence of the voids at the bonded portion could not be suppressed, and after the severe thermal cycling test, peeling occurred at the bonded portion. The conductive composition of Comparative example 5 contains the silver fine particles c having a number average particle diameter of primary particles exceeding 400 nm, so that connection between the silver fine particles with each other became a little by the sintering with heating at 200° C., whereby the electric resistivity was markedly increased and the thermal conductivity was lowered.

Figure 3:
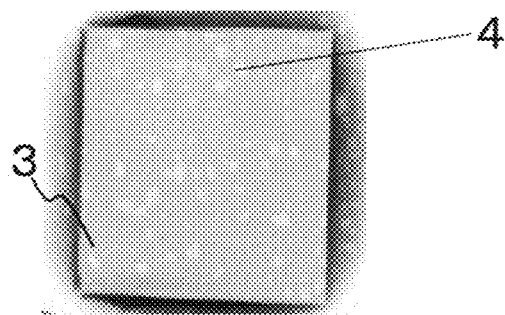
FIG. 3 is an X-ray image observing a back surface of a chip using the conductive composition of Examples 1 according to the present embodiment.
Figure 4:
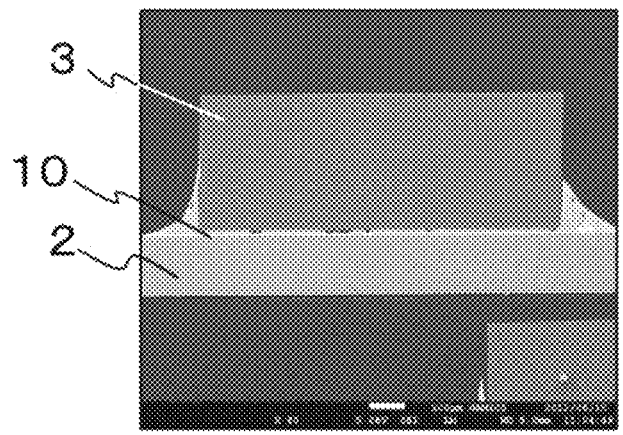
FIG. 4 is an FE-SEM image (100-fold) of a cross-section of electronic parts (test piece) using the conductive composition of Examples 1 according to the present embodiment.
Figure 5:
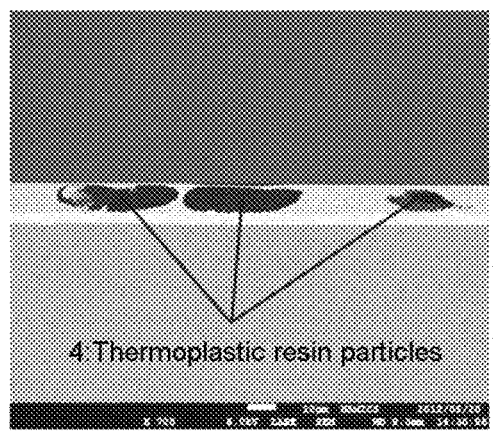
FIG. 5 is an FE-SEM image (700-fold) which is enlarged image of a part (the bonded portion) of the cross-section of the electronic parts (test piece) of FIG. 4.
Figure 6:
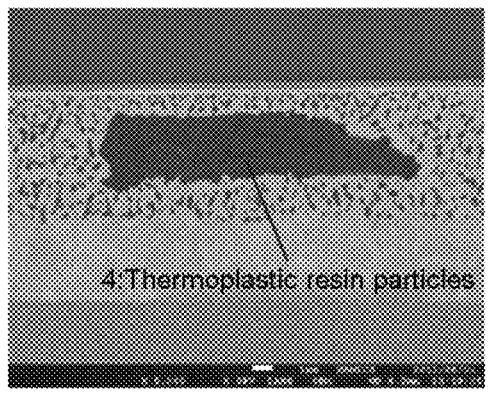
FIG. 6 is an FE-SEM image (5,000-fold) which is enlarged image of a part (the bonded portion) of the cross-section of the electronic parts (test piece) of FIG. 4.
Figure 7:
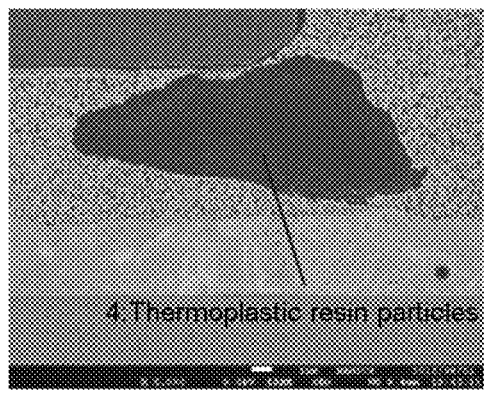
FIG. 7 is an FE-SEM image (5,000-fold) which is enlarged image of a part (the bonded portion) of the cross-section of the electronic parts (test piece) of FIG. 4.

FIG. 3 is an X-ray image observing the back surface of the chip using the conductive composition of Examples 1. FIG. 4 is an FE-SEM image (100-fold) of the cross-sectional view of the electronic parts (test piece) using the conductive composition of Examples 1, and FIGS. 5 to 7 are enlarged views of a part of FIG. 4 (FIG. 5: 700-fold, FIG. 6: 5,000-fold, FIG. 7: 5,000-fold).

As shown in FIG. 3, at the bonded portion of the back surface of the chip, generation of the voids cannot be confirmed. In FIG. 3, the reference numeral 4 is the thermoplastic resin particles and not voids. Also, as explained in the schematic drawing of FIG. 1, from the results shown in FIGS. 4 to 7, at the bonded portion 10, (C) the thermoplastic resin particles 4 was deformed, the volume shrinkage by the sintering of the silver fine particles (A) was suppressed and the thickness of the bonded portion 10 was maintained. As shown in FIG. 6 and FIG. 7, it can be confirmed that the portions other than the thermoplastic resin particles 4 form a porous sintered body in which the silver fine particles (A) are sintered and connected with each other.

Figure 8:
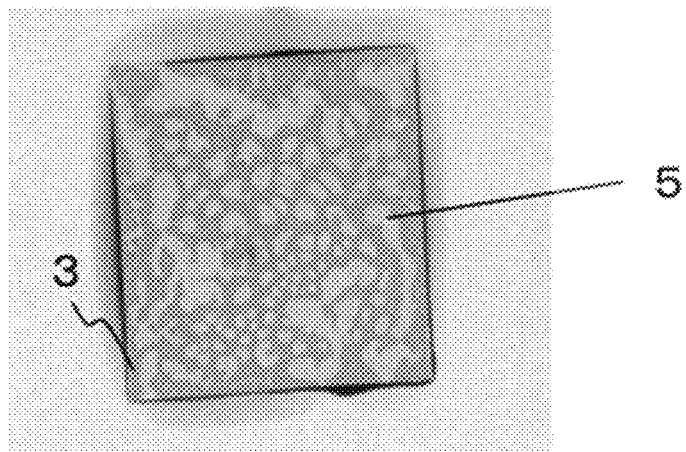
FIG. 8 is an X-ray image observing a back surface of a chip using the conductive composition of Reference example according to the conventional example.
Figure 9:
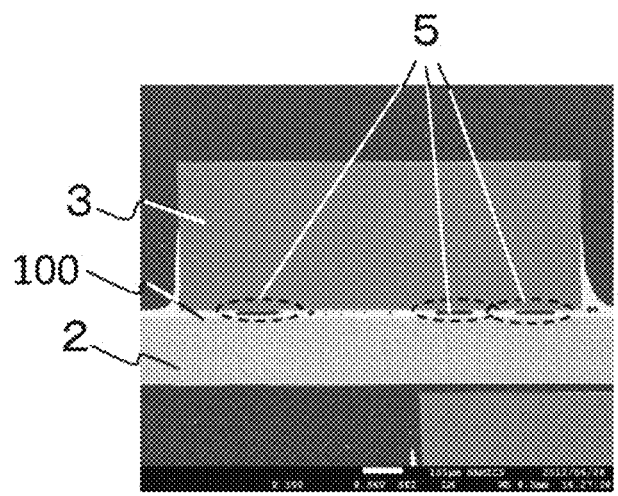
FIG. 9 is an FE-SEM image (100-fold) which is enlarged image of a part (the bonded portion) of the cross-section of the electronic parts (test piece) using the conductive composition of Reference example according to the conventional example.

FIG. 8 is an X-ray image observing the back surface of the chip using the conductive composition of Reference example. FIG. 9 is a cross-sectional view of the bonded portion at 100-fold in which the chip after curing by heating of Reference example and the substrate are bonded, and FIG. 10 is an enlarged view of a part of FIG. 9 (FIG. 9: 500-fold).

As shown in FIG. 8, a large number of the voids 5 were generated at the bonded portion at the back surface of the chip.

Figure 10:
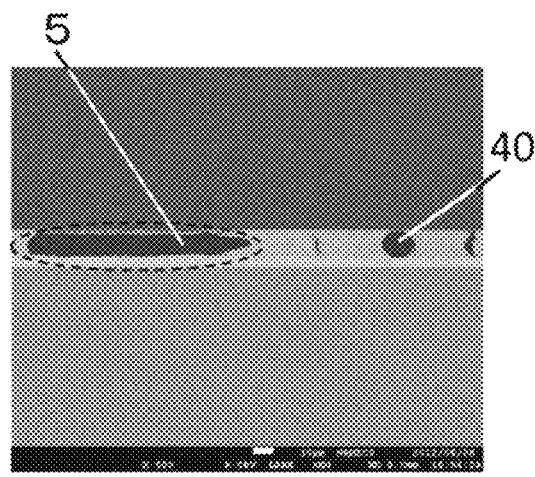
FIG. 10 is an FE-SEM image (500-fold) which is enlarged image of a part (the bonded portion) of the cross-section of the electronic parts (test piece) of FIG. 9.

In addition, as explained in the schematic drawing of FIG. 2, from the results shown in FIG. 9 and FIG. 10, it could be confirmed when the silver fine particles (A) were sintered and the volume was shrunk, the voids 5 were generated between the sintered body 100 of the silver fine particles the volume of which had shrunk by the sintering and the Si chip due to the spherical spacers 40 which do not deform.

INDUSTRIAL APPLICABILITY

According to the present invention, the thermoplastic resin particles in the conductive composition deform at the time of sintering the silver fine particles whereby the coating thickness can be maintained, follows the volume shrinkage of the bonded portion by the sintering of the silver fine particles, and suppress occurrence of the voids and can retain the bonding strength. Also, in the present invention, by containing the specific thermoplastic resin particles in the conductive composition, the modulus of elasticity of the bonded portion bonded by the conductive composition can be made small, and crack of the objects to be bonded, crack at the bonded portion and peeling at the bonding interface, etc., can be suppressed. The bonded portion obtained by the conductive composition of the present invention is also excellent in the points of electric conductivity and thermal conductivity, and it is suitable for a bonding member of a semiconductor device such as bumps and the die attach material, etc.

EXPLANATION OF REFERENCE NUMERALS

1: Conductive composition, 2: Substrate, 3: Semiconductor element (chip), 4: Thermoplastic resin particles, 5: Voids, 10: Bonded portions, 40: Spacers, 100: Sintered body

The invention claimed is:

1. A conductive composition which comprises (A) silver fine particles having a number average particle diameter of primary particles of 40 nm to 400 nm, (B) a solvent and (C) thermoplastic resin particles having a maximal value of an endothermic peak in a DSC chart, obtained by a measurement using a differential scanning calorimeter, within a range of 80° C. to 170° C., wherein the thermoplastic resin particles (C) have a number average particle diameter of primary particles of 1 μm to 50 μm, and the composition further comprises (D) metal particles having a number average particle diameter of primary particles of 0.5 μm to 20 μm.

2. The conductive composition according to claim 1, wherein the silver fine particles (A) have (a) a number average particle diameter of primary particles of 40 nm to 350 nm, (b) a crystallite diameter of 20 nm to 70 nm and (c) a ratio of a number average particle diameter of primary particles based on a crystallite diameter of 1.5 to 5.

3. The conductive composition according to claim 1, wherein the maximal value of the endothermic peak of the thermoplastic resin particles (C) in a DSC chart, obtained by a measurement using a differential scanning calorimeter, is within a range of 110° C. to 140° C.

4. The conductive composition according to claim 1, which contains 0.1 to 10 parts by mass of the thermoplastic resin particles (C) based on a total of 100 parts by mass of the silver fine particles (A) and the metal particles (D).

5. The conductive composition according to claim 1, wherein the thermoplastic resin particles (C) comprise at least one thermoplastic resin selected from the group consisting of a polyester, a polyurethane, a polyamide, a polycarbonate and a polyolefin.

6. The conductive composition according to claim 1, wherein the composition further comprises (E) at least one thermosetting resin, and the at least one thermosetting resin (E) is selected from the group consisting of an epoxy resin, a phenol resin and a silicone resin.

7. The conductive composition according to claim 1, wherein the solvent (B) is selected from the group consisting of diethylene glycol monobutyl ether acetate, 2-ethyl-1,3-hexane diol and 2,2,4-trimethyl-1,3-pentane diol 2-methylpropanoate.

8. An electronic part comprising a bonded portion which comprises the conductive composition according to claim 1.

9. A conductive composition which comprises (A) silver fine particles having a number average particle diameter of primary particles of 40 nm to 400 nm, (B) a solvent and (C) thermoplastic resin particles having a maximal value of an endothermic peak in a DSC chart, obtained by a measurement using a differential scanning calorimeter, within a range of 80° C. to 170° C., wherein the thermoplastic resin particles (C) have a number average particle diameter of primary particles of 1 μm to 50 μm, and the solvent (B) is selected from the group consisting of diethylene glycol monobutyl ether acetate, 2-ethyl-1,3-hexane diol and 2,2,4-trimethyl-1,3-pentane diol 2-methylpropanoate.

10. The conductive composition according to claim 9, wherein the silver fine particles (A) have (a) a number average particle diameter of primary particles of 40 nm to 350 nm, (b) a crystallite diameter of 20 nm to 70 nm and (c) a ratio of a number average particle diameter of primary particles based on a crystallite diameter of 1.5 to 5.

11. The conductive composition according to claim 9, wherein the maximal value of the endothermic peak of the thermoplastic resin particles (C) in a DSC chart, obtained by a measurement using a differential scanning calorimeter, is within a range of 110° C. to 140° C.

12. The conductive composition according to claim 9, wherein the thermoplastic resin particles (C) comprise at least one thermoplastic resin selected from the group consisting of a polyester, a polyurethane, a polyamide, a polycarbonate and a polyolefin.

13. The conductive composition according to claim 9, wherein the composition further comprises (E) at least one thermosetting resin, and the at least one thermosetting resin (E) is selected from the group consisting of an epoxy resin, a phenol resin and a silicone resin.

14. An electronic part comprising a bonded portion which comprimes the conductive composition according to claim 9.

15. The conductive composition according to claim 9, wherein the composition further comprises (D) metal particles having a number average particle diameter of primary particles of 0.5 μm to 20 μm.

16. The conductive composition according to claim 15, which contains 0.1 to 10 parts by mass of the thermoplastic resin particles (C) based on a total of 100 parts by mass of the silver fine particles (A) and the metal particles (D).

17. A conductive composition which comprises (A) silver fine particles having a number average particle diameter of primary particles of 40 nm to 400 nm, (B) a solvent and (C) thermoplastic resin particles having a maximal value of an endothermic peak in a DSC chart, obtained by a measurement using a differential scanning calorimeter, within a range of 80° C. to 170° C., wherein the thermoplastic resin particles (C) have a number average particle diameter of primary particles of 1 μm to 50 μm, and the solvent (B) is a solvent having a hydroxyl group and having a boiling point of 180 to 265° C.

18. The conductive composition according to claim 17, wherein the silver fine particles (A) have (a) a number average particle diameter of primary particles of 40 nm to 350 nm, (b) a crystallite diameter of 20 nm to 70 nm and (c) a ratio of a number average particle diameter of primary particles based on a crystallite diameter of 1.5 to 5.

19. The conductive composition according to claim 17, wherein the composition further comprises (D) metal particles having a number average particle diameter of primary particles of 0.5 μm to 20 μm.

20. The conductive composition according to claim 19, which contains 0.1 to 10 parts by mass of the thermoplastic resin particles (C) based on a total of 100 parts by mass of the silver fine particles (A) and the metal particles (D).

21. The conductive composition according to claim 17, wherein the maximal value of the endothermic peak of the thermoplastic resin particles (C) in a DSC chart, obtained by a measurement using a differential scanning calorimeter, is within a range of 110° C. to 140° C.

22. The conductive composition according to claim 17, wherein the thermoplastic resin particles (C) comprise at least one thermoplastic resin selected from the group consisting of a polyester, a polyurethane, a polyamide, a polycarbonate and a polyolefin.

23. The conductive composition according to claim 17, wherein the composition further comprises (E) at least one thermosetting resin, and the at least one thermosetting resin (E) is selected from the group consisting of an epoxy resin, a phenol resin and a silicone resin.

24. An electronic part comprising a bonded portion which comprises the conductive composition according to claim 17.

* * * * *